(12) United States Patent
Kumar et al.

(10) Patent No.: US 8,138,833 B1
(45) Date of Patent: Mar. 20, 2012

(54) COMMON-MODE FEEDBACK AMPLIFIER

(75) Inventors: Ajay Kumar, Dallas, TX (US); Krishnaswamy Nagaraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/901,082

(22) Filed: Oct. 8, 2010

(51) Int. Cl.
*H03F 3/45* (2006.01)
(52) U.S. Cl. ......................................... 330/258; 330/260
(58) Field of Classification Search .................. 330/258, 330/260, 261
See application file for complete search history.

(56) References Cited

U.S. PATENT DOCUMENTS

| | | | | |
|---|---|---|---|---|
| 4,037,170 A | * | 7/1977 | Richards | 330/69 |
| 5,049,831 A | * | 9/1991 | Westwick | 330/107 |
| 5,614,864 A | * | 3/1997 | Stubbe et al. | 330/69 |
| 5,760,648 A | * | 6/1998 | Koifman et al. | 330/258 |
| 7,893,766 B1 | * | 2/2011 | Cranford et al. | 330/258 |

* cited by examiner

*Primary Examiner* — Henry Choe
(74) *Attorney, Agent, or Firm* — Alan A. R. Cooper; Wade James Brady, III; Frederick J. Telecky, Jr.

(57) ABSTRACT

A circuit is provided for use with a reference voltage. The circuit includes a voltage source, a common-mode feedback amplifier and a feedback impedance portion. The common-mode feedback amplifier may be connected to the voltage source and may be arranged to receive the reference voltage. The common-mode feedback amplifier may include an input stage, an output stage, a positive input, a negative input and an output. The output may be connected to the feedback impedance portion. The feedback impedance portion may additionally be connected to one of the positive input and the negative input. A feedback factor, based on the feedback impedance portion, is less than one.

20 Claims, 7 Drawing Sheets

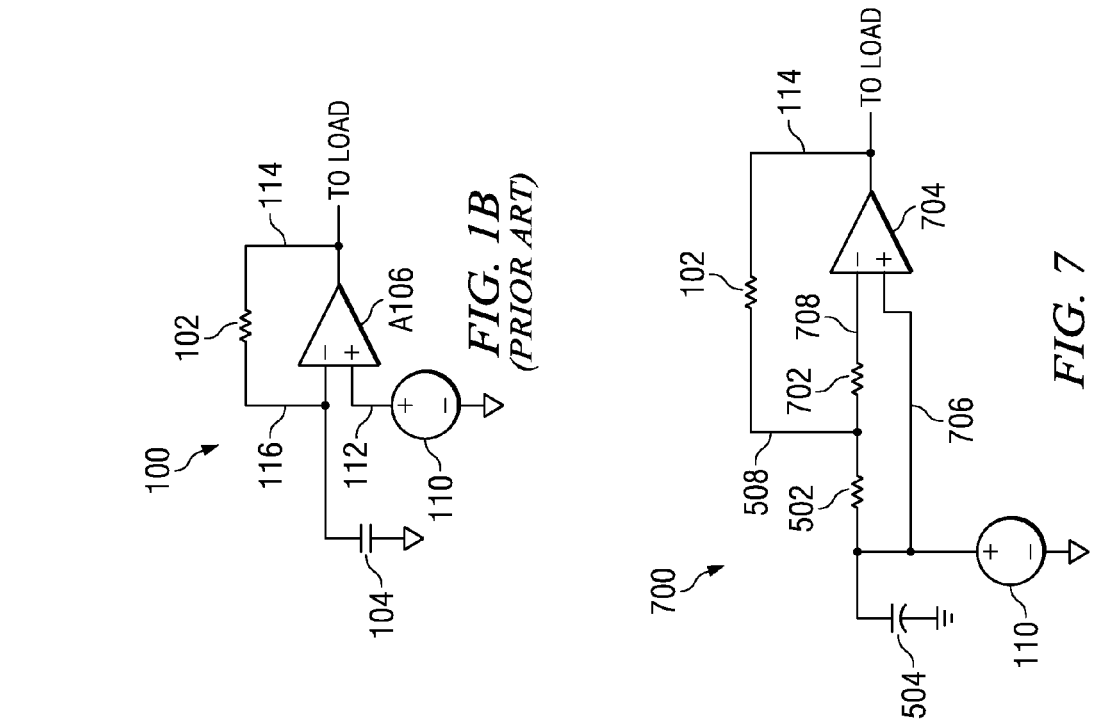
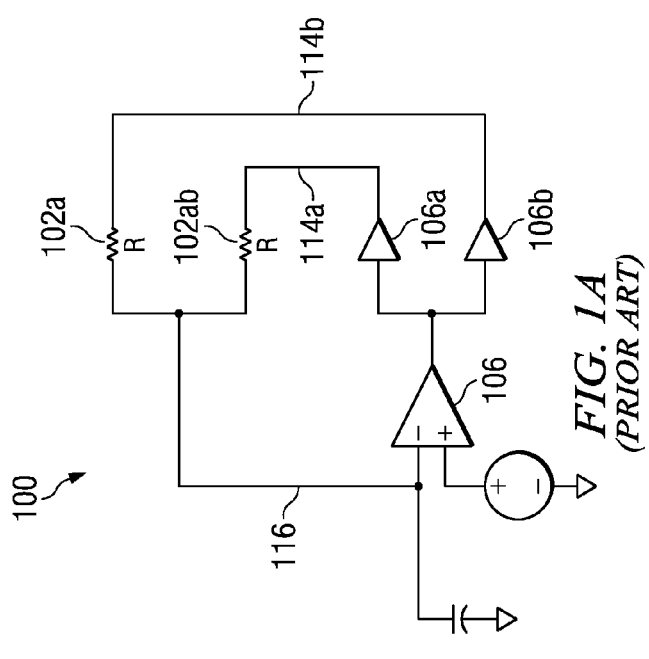
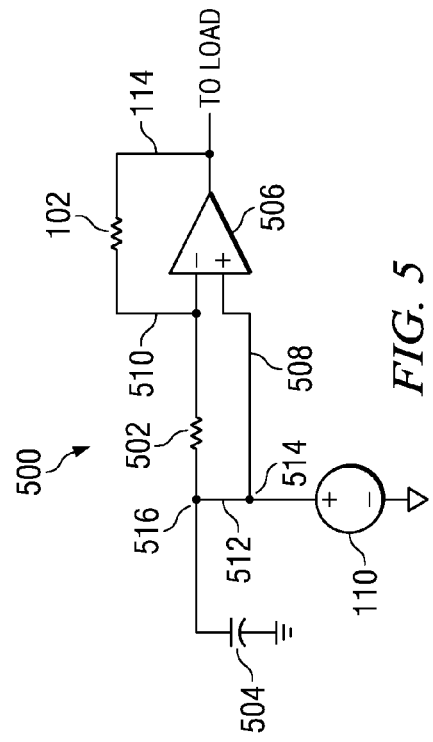

COMMON-MODE FEEDBACK AMPLIFIER

BACKGROUND

A conventional electrical signal is a voltage between an electrical conductor and another electrical conductor. The most common form of electrical signal is where one of the conductors is at ground potential and this form is usually referred to as unbalanced. There is also a common form of signal where neither conductor is at ground potential and each conductor carries a voltage relative to ground potential. This form of signal is usually referred to as balanced or differential.

Differential signals are the voltage difference between the conductors. The average potential of both conductors is usually referred to as the common-mode signal and that common-mode signal is equal on both conductors. Differential signals are the voltage difference between the conductors that represent the information carried by the signal and they vary around the common-mode voltage. When the differential signal on one conductor increases, the differential signal on the other conductor decreases by an equal amount, keeping the common-mode voltage constant.

A differential amplifier performs amplification of the differential signal value without any change in the common-mode value. Conventional use of a differential-in differential-out amplifier requires consideration of means to adjust the gain of the amplifier. Common practice uses amplifier in negative feedback configuration where the feedback through an external network determines the amplifier gain. Since this forms a closed loop signal path through the amplifier and the feedback network, it is usually referred to as closed loop gain or, more simply, gain. Closed loop gain represents how much an input signal is amplified at the output of the amplifier. The amplifier gain is commonly known as amp gain or amp open loop gain. Open loop gain is derived from amplifier gain and feedback factor. Open loop gain is measured by breaking the closed loop feedback circuit anywhere in the loop and measuring the gain at one of the broken end for an input signal applied to other end.

As each signal, differential and common-mode, passes through the differential amplifier circuit, special attention is required for treatment of the common-mode signal to minimize the effect on differential signal of the differential amplifier due to the common-mode value. This special attention usually takes the form of additional circuits and internal feedback dedicated to keep common-mode stable at the output. Usually the common-mode circuit consists of an extra gain stage and requires bandwidth large enough to suppress the even harmonic components; in general they consume a significant proportion of the power used by the whole circuit.

A differential amplifier can be either a differential-in differential-out amplifier or a differential-in single-ended-out differential amplifier. A differential-in differential-out amplifier circuit includes a signal path amplifier and a common mode feedback amplifier. A common mode feedback circuit is essential for differential-in differential-out amplifiers. A common mode feedback amplifier is a differential-in single-ended-out differential amplifier and is used to stabilize the output voltage in differential-in differential-out amplifiers. Throughout this application, terms "differential amplifier" and "differential-in differential-out amplifier" are used interchangeably. A more detailed explanation of a conventional differential-in and single-ended-out amplifier will now be discussed below with reference to FIG. 1.

FIGS. 1A and 1B illustrate an example conventional common mode feedback (CMFB) amplifier 100.

As illustrated in FIG. 1A, conventional CMFB amplifier 100 includes a differential amplifier 106, two singled-ended amplifiers 106a and 106b and two resistors 102a and 102b. Differential amplifier 106 is exclusively part of the CMFB path, whereas singled-ended amplifiers 106a and 106b and resistors 102a and 102b are actually part of the main differential amplifier (this will become clear later).

A voltage source 110 is arranged to generate an input signal 112 connected to the positive input of differential amplifier 106. Differential amplifier 106 is arranged to provide an output to single-ended amplifiers 106a and 106b. A first terminal of resistor 102a is arranged to receive output signal 114a from amplifier 106a and a first terminal of resistor 102b is arranged to receive output signal 114b from amplifier 106b. A second terminal of resistor 102a and a second terminal of resistor 102b are both joined to provide an input signal 116 to the negative input of differential amplifier 106.

Differential amplifier 106 has an open-loop gain of $A_{106}$. The single-ended amplifiers 106a and 106b have open-loop gain of $A_{106a}$ and $A_{106b}$, respectively. Nominally, $A_{106a}$ and $A_{106b}$ are equal. When CMFB amplifier 100 is configured as open-loop, i.e. resistors 102a and 102b are removed from the circuit, the magnitude of output signal 114a equals the voltage difference between the positive and negative inputs of differential amplifier 106 multiplied times the combined gain of differential amplifier 106 and single-ended amplifier 106a or $A_{106} \times A_{106a}$. The voltage polarity of output signal 114a will be the inverse polarity of the voltage of the negative input to differential amplifier 106 and the same polarity of the voltage of the positive input to differential amplifier 106 subtracted from the voltage of the negative input to differential amplifier 106. Similarly the magnitude of output signal 114b equals the voltage difference between the positive and negative inputs of differential amplifier 106 multiplied by the combined gain of differential amplifier 106 and single-ended amplifier 106b or $A_{106} \times A_{106b}$. The voltage polarity of output signal 114b will be the inverse polarity of the voltage of the negative input to differential amplifier 106 and the same polarity of the voltage of the positive input to differential amplifier 106 subtracted from the voltage of the negative input to differential amplifier 106. In close loop, that is when the second terminals of resistors 102a and 102b are connected to the negative input of differential amplifier 106, conventional CMFB amplifier 100 has gain of approximately one.

For the purpose of simplification, CMFB amplifier 100 shown in FIG. 1A can be represented by the equivalent circuit shown if FIG. 1B. In FIG. 1B, differential amplifier 106 and single-ended amplifiers 106a and 106b are combined into one equivalent differential-input single-ended output amplifier A106 and two resistors 102a and 102b are combined into one equivalent resistor 102. The equivalent CMFB 100 shown in FIG. 1A will be further used herein.

Conventional common mode feedback amplifier 100 allows the differential-in differential-out amplifier to have different common mode voltage at the input and the output and provides a stable common mode voltage level, which allows the output signal to use the full dynamic range of the output swing. Additionally, it suppresses any in-band even harmonic components from the signal path. Decoupling of the common mode component at the output signals of a differential amplifier enables the differential amplifier to realize its full dynamic range. Typically in a common mode feedback amplifier, the common mode value of output signal is fed back into the differential amplifier, which compares it with a stable DC reference voltage for removing the common mode component from the output signals of the differential amplifier. Ideally, the common mode signal should be a stable DC voltage.

A differential amplifier is connected in negative feedback configuration by connecting the output to the negative input through a feedback network. The voltage output of differential amplifier 106 gives a linear phase shift to its input with respect to frequency. In the situation where the output phase shift of differential amplifier 106 becomes 180° at a particular frequency, input and output signal would be in phase, thus becoming a positive feedback. A condition of input signal and output signal being in phase for differential amplifier 106 with a closed loop gain equal to one or greater than one, results in the circuit configuration of CMFB amplifier 100 becoming unstable. For differential amplifier 106, phase margin is defined as the phase shift due to differential amplifier 106, at a frequency where gain is 0 dB, subtracted from 180°. For example, if the phase shift of differential amplifier 106 were 135°, at a frequency where gain is 0 dB, then the phase margin for the circuit of CMFB amplifier 100 would be 45° (180°-135°=45°). Typically, a larger value of phase margin is desired, as a circuit with a small phase margin might be susceptible to instability.

Stability of differential amplifiers will be described in greater detail with reference to FIG. 2.

FIG. 2 includes a waveform 202 and a waveform 204, of conventional CMFB amplifier 100. The x-axis of each waveform is time, whereas the y-axis in each waveform is voltage. Waveform 202 represents a signal applied to the common-mode reference terminal of conventional CMFB amplifier 100 and waveform 204 represents typical oscillations superimposed on the common-mode signal, observed at the output of CMFB amplifier 100, due to common-mode instability or oscillation.

In the figure, waveform 202 indicates that the input signal to the common-mode reference terminal of conventional CMFB amplifier 100 is at 400 mV, as shown by a portion 206, before the CMFB amplifier 100 is turned on at a time 208. Waveform 204 indicates a portion 214, which may be in an unknown state, before the CMFB amplifier 100, is turned on.

To test the stability of the system, in this example, at time 208, a positive step signal is applied to the common-mode reference terminal of conventional CMFB amplifier 100 by increasing it to 600 mV from 400 mV. A stable common-mode feedback loop or a common-mode feedback loop with good phase margin will follow the stimulus. However, if common-mode feedback loop does not have enough phase margin or is unstable then it will start to oscillate with such a stimulus. This step change induces instability in the common-mode portion of CMFB amplifier 100. As such, as indicated by a portion 216 of waveform 204, the common-mode signal includes a high frequency signal having a high frequency and voltage varying between 200-700 mV. This high frequency oscillation continues throughout time period 210, indicating the instability of the loop. Next, a negative step stimulus is applied to ensure the correct loop operation across all conditions, as discussed below.

At a time 218, negative step signal is applied to the common-mode reference terminal of conventional CMFB amplifier 100 by decreasing its value to 400 mV from 600 mV. Even though the new 400 mV signal is applied throughout a time period 220, the input step change at time 218 induces instability in the common-mode portion of CMFB amplifier 100. As such, as indicated by a portion 222 of waveform 204, the common-mode signal is oscillating with a high frequency signal with amplitude varying between 0-500 mV. This high frequency signal continues throughout period 222.

The high frequency signal will continue as a result of the discontinuous and dramatic increase/decrease of an input pulse. Therefore, such an input pulse may be considered a type of stress test of the stability of a common-mode feedback amplifier. A greater increase/decrease of an input pulse in which a common-mode feedback amplifier can manage, without generating the high frequency signal such as waveform 204, translates into a more stable common-mode feedback amplifier. The stability of a common-mode feedback amplifier can increase with an increase in the phase margin.

FIG. 3 illustrates an example conventional differential-in differential-out amplifier 300.

Conventional differential-in differential-out amplifier 300 operates to amplify a differential between input signal $V_i^+$ and input signal $V_i^-$ and provides an amplified and common mode adjusted differential output signal between output $V_o^+$ and $V_o^-$. The magnitude of the differential output signal is equal to a gain of differential-in differential-out amplifier 300 multiplied by the differential input signal. The common mode components of the differential output signal are adjusted in order to accommodate the different common mode components at the input and the output. The adjustment of the common mode components enables differential-in differential-out amplifier 300 to supply an output differential signal which is able to realize a wide dynamic range as provided by the source of power. The output differential signal overrides the common mode signal. An ideal common mode signal is a fixed DC voltage. If a common mode signal has such a large signal swing by itself then it reduces the available dynamic range for the differential signal and thus is not desirable.

As illustrated in the figure, differential-in differential-out amplifier 300 includes a differential amplifier 302, a feedback impedance portion 304, a current mirror portion 305 and a feedback circuit 306.

Feedback impedance portion 304 and feedback circuit 306 is a transistor level representation of the circuit of conventional CMFB amplifier 100 as illustrated in FIG. 1.

Differential amplifier 302 operates to amplify a differential between input signal $V_i^+$ and $V_i^-$ and provide an amplified differential output signal between output signal $V_o^+$ and $V_o^-$. The differential output signal is equal to the gain of differential amplifier 302 multiplied by the differential input signal.

Feedback impedance portion 304 operates as a voltage divider in order to determine the common mode differential signal of $V_o^+$ and $V_o^-$ and as denoted by a node 360.

Feedback circuit 306 operates to provide a feedback signal used for compensating or adjusting common mode components from $V_o^+$ and $V_o^-$. The common mode differential signal as denoted by node 360 is received by feedback circuit 306 in order to generate a signal for applying compensation to differential amplifier 302 for adjusting the common mode differential between $V_i^+$ and $V_i^-$ from the output signals $V_o^+$ and $V_o^-$. Adjustment of the common mode differential enables differential-in differential-out amplifier 300 to realize the full dynamic range as provided by the differential between $V_{DD}$ and ground.

Differential amplifier 302 includes a PMOS tail current source 330, a positive input differential portion 314, a negative input differential portion 316, a positive output differential portion 318 and a negative output differential portion 320.

PMOS tail current source 330 operates to provide a source of current for positive input differential portion 314 and for negative input differential portion 316. Positive input differential portion 314 operates to receive and amplify input signal $V_i^+$. Negative input differential portion 316 operates to receive and amplify $V_i^-$. Positive output differential portion 318 and negative output differential portion 320 provide compensation to output signal $V_o^+$ and $V_o^-$ for common mode differential as provided by input signal $V_i^+$ and $V_i^-$. Positive output differential portion 318 and negative output differential portion 320 also provide pole-frequency compensation in order to improve the phase margin of the entire amplifier.

PMOS tail current source 330 is connected between $V_{DD}$ and each of positive input differential portion 314 and negative input differential portion 316. Each of positive input differential portion 314 and negative input differential portion 316 are connected between PMOS tail current source 330 and ground. Each of positive output differential portion 318 and negative output differential portion 320 are connected between $V_{DD}$ and ground.

The source of PMOS tail current source 330 is connected to $V_{DD}$, the gate of PMOS tail current source 330 is connected to a bias voltage 301 and the drain of PMOS tail current source 330 is connected to source of each of positive input differential portion 314 and negative input differential portion 316.

Positive input differential portion 314 includes a PMOS differential transistor 332 and an NMOS load transistor 334. The source of PMOS differential transistor 332 is connected to the drain of PMOS tail current source 330. The drain of PMOS differential transistor 332 is connected to the drain of NMOS load transistor 334. The gate of PMOS differential transistor 332 is arranged to receive positive input voltage $V_i^+$. The source of NMOS load transistor 334 is connected to ground, whereas the gate of NMOS load transistor 334 is connected to negative input differential portion 316.

Negative input differential portion 316 includes a PMOS differential transistor 336 and an NMOS load transistor 338. The source of PMOS differential transistor 336 is connected to the drain of PMOS tail current source 330. The drain of PMOS differential transistor 336 is connected to the drain of NMOS load transistor 338. The gate of PMOS differential transistor 336 is arranged to receive negative input signal $V_i^-$. The source of NMOS load transistor 338 is connected to ground, whereas the gate of NMOS load transistor 338 is connected to the gate of NMOS load transistor 334.

Positive output differential portion 318 includes a PMOS transistor 346, an NMOS transistor 348 and a compensation capacitor 350. The source of PMOS transistor 346 is connected to $V_{DD}$. The drain of PMOS transistor 346 is connected to the drain of NMOS transistor 348. The gate of PMOS transistor 346 is connected to the gate of NMOS transistor 348. Compensation capacitor 350 is connected between the gate of PMOS transistor 346 (and the gate of PMOS transistor 346) and the drain of PMOS transistor 346 (and the drain of PMOS transistor 346). A node 352 provides a positive output signal $V_o^+$ and is connected to feedback impedance portion 304.

Negative output differential portion 320 includes a PMOS transistor 340, an NMOS transistor 342 and a compensation capacitor 344. The source of PMOS transistor 340 is connected to $V_{DD}$. The drain of PMOS transistor 340 is connected to the drain of NMOS transistor 342. The gate of PMOS transistor 340 is connected to the gate of NMOS transistor 342. Compensation capacitor 344 is connected between the gate of PMOS transistor 340 (and the gate of NMOS transistor 342) and the drain of PMOS transistor 340 (and the drain of NMOS transistor 342). A node 354 provides a negative output voltage $V_o^-$ and is connected to feedback impedance portion 304.

Feedback impedance portion 304 includes a resistor 356 and a resistor 358. One terminal of resistor 356 is connected to node 354, whereas the other terminal of resistor 356 is connected to node 360. One terminal of resistor 358 is connected to node 352, whereas the other terminal of resistor 358 is connected to node 360. Node 360 is additionally connected to feedback circuit 306.

Current mirror portion 305 includes a NMOS current mirror transistor 311 and a NMOS current mirror transistor 312. The gates of NMOS current mirror transistor 311 and NMOS current mirror transistor 312 are connected to feedback circuit 306. The sources of NMOS current mirror transistor 311 and NMOS current mirror transistor 312 are connected to ground. The drains of NMOS current mirror transistor 311 and NMOS current mirror transistor 312 are connected to differential amplifier 302.

Feedback circuit 306 is arranged to receive signal $V_{ref}$ as an input voltage. Feedback impedance portion 304 is arranged between feedback circuit 306 and differential amplifier 302. Referring to FIG. 1, feedback impedance portion 304 corresponds to resistor 102. The combination of feedback circuit 306 and differential amplifier 302 corresponds to differential amplifier 106. The signal $V_{ref}$ is desired output common mode voltage and is typically configured to a voltage value near the midpoint between $V_{DD}$ and ground.

Feedback circuit 306 includes a PMOS tail current source 308, a sensing leg 309 and a reference leg 310. The source of PMOS tail current source 308 is connected to $V_{DD}$, the gate of PMOS tail current source 308 is connected to a bias voltage 301 and the drain of PMOS tail current source 308 is connected to each of sensing leg 309 and reference leg 310. Each of sensing leg 309 and reference leg 310 are connected between the drain of PMOS tail current source 308 and ground.

Sensing leg 309 includes a PMOS differential transistor 326 and an NMOS load transistor 328. The source of PMOS differential transistor 326 is connected to the drain of PMOS tail current source 308. The drain of PMOS differential transistor 326 is connected to the drain of NMOS load transistor 328. The gate of PMOS differential transistor 326 is connected to feedback impedance portion 304. There is an intrinsic capacitance from the gate of PMOS differential transistor 326 to the source of PMOS differential transistor 326. This intrinsic capacitance corresponds to intrinsic capacitance 104 of FIG. 1. The source of NMOS load transistor 328 is connected to ground, whereas the gate of NMOS load transistor 328 is connected to the drain of NMOS load transistor 328 as well as to the gate of NMOS current mirror transistor 311 and NMOS current mirror transistor 312. The sources of NMOS current mirror transistor 311 and NMOS current mirror transistor 312 are connected to ground. The drains of transistors 311 and 312 provide the feedback signal back to the amplifier 302. The drain of NMOS current mirror transistor 311 is connected to the drain of PMOS differential transistor 332, to the drain of NMOS load transistor 334 and the gate of NMOS transistor 342, to a terminal of compensation capacitor 344 and to the gate of PMOS transistor 340. The drain of NMOS current mirror transistor 312 is connected to the drain of PMOS differential transistor 336, to the drain of NMOS load transistor 338, to the gate of NMOS transistor 348, to a terminal of compensation capacitor 350 and to the gate of PMOS transistor 346.

Reference leg 310 includes a PMOS differential transistor 322 and an NMOS load transistor 324. The source of PMOS differential transistor 322 is connected to the drain of PMOS tail current source 308. The drain of PMOS differential transistor 322 is connected to the drain of NMOS load transistor 324. The gate of PMOS differential transistor 322 is arranged to receive signal $V_{ref}$. The source of NMOS load transistor 324 is connected to ground, whereas the gate of NMOS load transistor 324 is connected to the drain of NMOS load transistor 324 to minimize the mismatch between the differential pair.

Current mirror portion 305 operates to mirror or replicate the current as realized through the drain of NMOS load transistor 328, i.e. if the current traversing through NMOS load transistor 328 increases, then the currents traversing through the drains of NMOS current mirror transistor 311 and NMOS current mirror transistor 312 also increase and vice-versa.

The common mode amplifier 306 of amplifier 300 controls the common mode value of the output signal $V_o$+ and $V_o$-. The common mode value of the differential output signal is also produced at node 360 of feedback impedance portion 304. The common mode differential is also received by the gate of PMOS differential transistor 326. A difference between the voltage applied to the gate of PMOS differential transistor 326 and signal $V_{ref}$ is fed back to the differential part 302 of the amplifier to form a negative feedback loop, which causes an increase or decrease in the amount of current traversing through the drain of PMOS differential transistor 326, such that the common mode voltage of the outputs $V_o$+ and $V_o$- comes closer to $V_{ref}$.

A voltage at the gate of PMOS differential transistor 326 which is higher than $V_{ref}$ will cause the amount of current traversed through the drain of PMOS differential transistor 326 to decrease. A voltage at the gate of PMOS differential transistor which is lower than $V_{ref}$ will cause the amount of current traversed through the drain of PMOS differential transistor 326 to increase. A smaller current realized in NMOS load transistor 328 corresponds with a smaller current traversing through NMOS current mirror transistor 311 and NMOS current mirror transistor 312. A larger current realized in NMOS load transistor 328 corresponds with a larger current traversing through NMOS current mirror transistor 311 and NMOS current mirror transistor 312. A smaller amount of current traversing through NMOS current mirror transistor 311 and NMOS current mirror transistor 312 pushes the node 335 and node 347 to a higher voltage as current traversing through NMOS load transistor 334, NMOS load transistor 338, and PMOS tail current source 330 are constant.

The constant current traversing through PMOS tail current source 330 requires sum of the currents traversed through NMOS load transistor 334, NMOS load transistor 338, NMOS current mirror transistor 311 and NMOS current mirror transistor 312 to also be a constant. A smaller amount of current traversing through NMOS load transistor 311 and NMOS load transistor 312 results in the voltage applied to the gate of NMOS transistor 348 and NMOS transistor 342 to increase and vice-versa. A larger amount of current applied to the gate of NMOS transistor 348 and NMOS transistor 342 results in a larger amount of current traversing through the drains of NMOS transistor 348 and NMOS transistor 342 and vice-versa.

A larger amount of current traversing through the drains of NMOS transistor 348 and NMOS transistor 342 causes the voltages applied to output signals $V_o$+ and $V_o$- to be reduced and vice-versa. A reduction in the voltages applied to output signals $V_o$+ and $V_o$- is then reflected in the common mode differential as represented by node 360, which is also received by feedback circuit 306. This process is repeated until the voltage received at the gate of PMOS differential transistor 326 is the same voltage as applied to signal $V_{ref}$. Once the voltage received at the gate of PMOS differential transistor 326 is the same as the voltage applied to signal $V_{ref}$, the common mode of the differential signal as received by input signals $V_i$+ and $V_i$- is not produced at output signals $V_o$+ and $V_o$-. The common mode voltage of the output is placed to the desired voltage $V_{ref}$. A more detailed explanation of the operation of differential-in differential-out amplifier 300 will now be described.

Presume that initially, $V_{ref}$ is 500 mV, whereas the voltage of the signal at the gate of PMOS differential transistor 326 is 450 mV. Because the voltage at the gate of PMOS differential transistor 326 is smaller than the voltage at the gate of PMOS differential transistor 322, sensing leg 309 will start to pull more current, via NMOS load transistor 328. The mirror legs 311 and 312 of NMOS load transistor 328 is arranged with constant current NMOS load transistor 334 of positive input differential portion 314, and with constant current NMOS load transistor 338 of negative input differential portion 316 to form a negative feedback loop. The total sum of current though NMOS transistors 334, 338, 311 and 312 is equal to the constant tail current of PMOS transistor 330.

To simplify the discussion, just consider one side of differential amplifier 302 (as both sides are equal). When the current is increasing through NMOS load transistor 328, then as a result of the properties of the current mirror arrangement, the current will increase through NMOS load transistor 311. When the current increases through NMOS load transistor 311, then the charge build-up at the drain of NMOS load transistor 338 will decrease—just imagine NMOS load transistor 338 sucking more charges down from its drain to its source. The drain of NMOS load transistor 338 is connected to the gate of NMOS transistor 348 and the gate of PMOS transistor 346. As such, when the amount of charge at the drain of NMOS load transistor 338 decreases, the amount of charge at the gate of NMOS transistor 348 and at the gate of PMOS transistor 346 further decreases. When the charge at the gate of NMOS transistor 348 and at the gate of PMOS transistor 346 additionally decreases, NMOS transistor 348 draws less current and PMOS transistor 346 provides more current, in turn voltage at the output $V_o$+ increases and moves closer to $V_{ref}$. Accordingly, in such a case, the voltage at node 352 increases. This increase in voltage at node 352 increases the voltage at node 360, which then increases the voltage at the gate of PMOS differential transistor 326 and reduces the voltage difference between gates of PMOS differential transistor 326 and PMOS differential transistor 322.

In short, if the voltage $V_o$+ (and thus the voltage $V_o$-) is too low, the voltage at the gate of PMOS differential transistor 326 (sensing leg 309) will be lower than the voltage $V_{ref}$ at the gate of PMOS differential transistor 322 (reference leg 310). In response, a feedback arrangement will increase the voltage $V_o$+ (and thus the voltage $V_o$-), which will then increase the voltage at the gate of PMOS differential transistor 326 (sensing leg 309). But what happens if the voltage $V_o$+ (and thus the voltage $V_o$-) is increased too much, which will then increase the voltage at the gate of PMOS differential transistor 326 (sensing leg 309) too much? This will now be described.

Presume that initially, $V_{ref}$ is 500 mV, whereas the voltage at the gate of PMOS differential transistor 326 is 550 mV. Because the voltage at the gate of PMOS differential transistor 326 is more than the voltage at the gate of PMOS differential transistor 322, sensing leg 309 will start to pull less current, via NMOS load transistor 328. The mirror transistors NMOS 311 and 312 of NMOS load transistor 328 are arranged with NMOS load transistor 334 of positive input differential portion 314, and with NMOS load transistor 338 of negative input differential portion 316 to form the negative feedback loop. The total sum of current though NMOS transistors 334, 338, 311 and 312 is equal to the constant tail current of PMOS transistor 330.

To simplify the discussion, just consider one side of differential amplifier 302 (as both sides are equal). When the current is decreasing through NMOS load transistor 328, then as a result of the properties of the current mirror arrangement, the current will decrease through NMOS load transistor 311. When the current decreases through NMOS load transistor 311, then the charge build-up at the drain of NMOS load transistor 338 will increase—just imagine NMOS load transistor 338 sucking less charges down from its drain to its source, thus causing charges to build-up. The drain of NMOS load transistor 338 is connected to the gate of NMOS transistor 348 and the gate of PMOS transistor 346. As such, when the amount of charge at the drain of NMOS load transistor 311 increases, the amount of charge at the gate of NMOS transistor 348 and at the gate of PMOS transistor 346 additionally increases. When the charge at the gate of NMOS transistor 348 and at the gate of NMOS transistor 346 additionally increases, NMOS transistor 348 draws more current and PMOS transistor 346 provides less current to node 352. Accordingly, in such a case, the voltage at node 352 decreases. This decrease in voltage at node 352 decreases the voltage at node 360, which then decreases the voltage at the gate of PMOS differential transistor 326 and reduces the voltage difference between gate of PMOS differential transistors 326 and 322.

In short, if the voltage $V_o^+$ (and thus the voltage $V_o^-$) is too high, the voltage at the gate of PMOS differential transistor 326 (sensing leg 309) will be higher than the voltage $V_{ref}$ at the gate of PMOS differential transistor 322 (reference leg 310). In response, a feedback arrangement will decrease the voltage $V_o^+$ (and thus the voltage $V_o^-$), which will then decrease the voltage at the gate of PMOS differential transistor 326 (sensing leg 309).

The voltages at nodes 354 and 352 stabilizes around a predetermined value based on the voltage $V_{ref}$ as a result of the arrangement of differential amplifier 306, feedback impedance portion 304 and sensing leg 309.

Capacitors in semiconductor devices, for example compensation capacitors 344 and 350, typically require a significant amount of semiconductor geometric area. In general, differential amplifier 302 and feedback circuit 306 each require capacitors for operation. However, since capacitors in semiconductor devices require a significant amount of geometric area, the capacitors needed for differential amplifier 302 and feedback circuit 306 are shared as denoted by compensation capacitor 344 and compensation capacitor 350. Compensation capacitor 344 and compensation capacitor 350 have a dual purpose, as they serve the compensation capacitance needs for both differential amplifier 302 and feedback circuit 306. The capacitance value range needed for differential amplifier 302 to remain stable and the range needed for feedback circuit 306 to remain stable are different. In general, the capacitance values of compensation capacitor 344 and compensation capacitor 350 should fall within the range of capacitance values which are operable for both differential amplifier 302 and feedback circuit 306 to remain stable, i.e. realize sufficient phase margin in order to remain stable.

For stability of differential amplifier 306, it is desirable for the resistive portion of feedback impedance portion 304 to be a low resistance, i.e. the lower the resistance, higher the feedback pole is and more stable differential amplifier 306. However, a low resistive portion of feedback impedance portion 304 results in lower output impedance in-turn lower gain for the main signal path for differential amplifier 302, which is not desirable. Furthermore, a low resistive portion of feedback impedance portion 304 also starts to load the output stage and starts to direct a portion of the output signal power through feedback impedance portion 304 instead of to the load connected to output signals $V_o^+$ and $V_o^-$. Typically, it is desirable for the majority of the output signal power to be directed to the load being driven by output signals $V_o^+$ and $V_o^-$. As a result of the output load constraints, the resistive portion of feedback impedance portion 304 is typically selected to be at least a multiple of 10 times the load to be driven by output signals $V_o^+$ and $V_o^-$. However the higher resistive portion of feedback impedance portion 304 increases instability of common mode feedback amplifier 306 of the differential-in differential-out amplifier 300.

The capacitance constraints of compensation capacitors 344 and 350, i.e. shared constraints and stability constraints, combined with the resistive constraints for the resistive portion of feedback impedance portion 304, i.e. load and stability constraints, necessitate a geometric area size for compensation capacitors 344 and 350, which is relatively large. The relatively large geometric area typically required for compensation capacitors 344 and 350 results in increased costs for manufacturing conventional differential amplifier semiconductor devices.

In light of the above discussion, there are challenges in designing conventional common-mode, feedback amplifier 100. These challenges are drawn to the conflicting benefits and detriments of resistor 102 and parasitic capacitance 104.

Returning to FIG. 3, the output of conventional differential-in differential-out amplifier 300 is at node 352 and node 354. If the resistance value of feedback impedance portion 304 is relatively small, say for example, 100Ω, then it is beneficial for the operation of the common mode feedback. In this sense, it is better to keep the resistance value of feedback impedance portion 304, which corresponds to resistor 102 of FIG. 1, as a small value.

However, returning to FIG. 1, output signal 114 will take the path of least resistance. As such, in order to provide the majority of output signal 114 to the load, the resistance value of resistor 102 should be quite large, e.g., 100Ω or 10 times the resistance value of the load. The efficiency of conventional differential-in differential-out amplifier 300 may be measured in terms of the proportion of output signal 114 that is provided to the load. In other words, if more of output signal 114 is fed back through resistor 102, the less efficient the operation of conventional differential amplifier-in differential-out 300. In this sense, it is better to keep the resistance value of feedback impedance portion 304, which corresponds to resistor 102 of FIG. 1, as a very high value.

In light of the overall goals of maintaining beneficial operation of the common mode feedback and maintaining increased efficiency of conventional differential-in differential-out amplifier 300, it is difficult to choose an appropriate resistance value of feedback impedance portion 304.

To complicate matters, the capacitance value of parasitic capacitance 104 should be as small as possible. The product of the resistance value of resistor 102 and the capacitance value of parasitic capacitance 104, which is a pole in the feedback path, corresponds to a zero frequency in the feed-forward path. A zero in the feed-forward path boosts the gain and lags the phase, which in-turn worsens the phase margin of the common mode differential amplifier. Returning to FIG. 3, as discussed above feedback impedance portion 304 corresponds to resistor 102. Further, the intrinsic capacitance at the gate of PMOS differential transistor 326 corresponds to parasitic capacitance 104. To reduce the pole frequency, at least one of the resistance value of resistor 102 and the capacitance value of parasitic capacitance 104 must be reduced. In other words, to reduce the pole frequency, at least one of resistance value of feedback impedance portion 304 and the capacitance at the gate of PMOS differential transistor 326 must be reduced. To provide the maximum amount of output signal 114 to the load, the resistance value of feedback impedance portion 304 should not be reduced. Thus, to reduce the pole frequency, the capacitance at the gate of PMOS differential transistor 326 should be reduced. A smaller PMOS differential transistor means larger offset, which will reduce the swing in the output stage 346 and 340, in turn reducing the dynamic range.

Compensation capacitors are typically shared between a common-mode feedback path and a signal path of a differential-in differential-out amplifier. For example, returning to FIG. 3, compensation capacitors 344 and 350 are shared between the common-mode feedback path, e.g., positive output differential portion 318 and negative output differential portion 320, and the signal path, e.g., nodes 352 and 354.

To maximize the performance of a differential-in differential-out amplifier, generally a compensation capacitor is optimized based on the needs of differential-in differential-out amplifier. Since common mode feedback amplifier has one extra gain stage, optimization based only on the compensation capacitor is not sufficient. Based on the value of the compensation capacitor, the common mode feedback amplifier tends to oscillate and have a poor phase margin.

As discussed above using FIGS. 1-3, a conventional differential amplifier includes a signal path amplifier and a common-mode feedback path amplifier. Typically, the capacitance value of a compensation capacitor is set to maximize stability of a differential-in differential-out amplifier, when the closed loop gain is at its lowest value. For certain configurations, signal path of a differential amplifier may require reducing the compensation capacitor in order to improve its efficiency, resulting in an unstable common-mode feedback circuit. This may result in more power consumption because common-mode feedback circuit is a differential-in single-ended-out amplifier configured with a unity gain. The traditional implementation of a common-mode feedback amplifier, where a feedback resistor is connected between the output and input of the common-mode feedback circuit, may provide an unstable circuit. In order to improve stability of such a common-mode feedback circuit, a larger compensation capacitor may be required because of its high open loop gain, which may not be desirable by the signal path of a differential amplifier. Therefore, it's desirable to reduce the open loop gain of a common-mode feedback circuit in order to improve its stability without increasing the value of compensation capacitor.

What is needed is a stable differential amplifier that has a variable gain and that may be operated at low power.

BRIEF SUMMARY

The present invention provides a stable differential amplifier that has a variable gain and that may be operated at a low power.

In accordance with an aspect of the present invention, a circuit is provided for use with a reference voltage. The circuit includes a voltage source, a common-mode feedback amplifier and a feedback impedance portion. The common-mode feedback amplifier may be connected to the voltage source and may be arranged to receive the reference voltage. The common-mode feedback amplifier may include an input stage, an output stage, a positive input, a negative input and an output. The output may be connected to the feedback impedance portion. The feedback impedance portion may additionally be connected to one of the positive input and the negative input. Loop gain, based on the feedback impedance portion, is less than one.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIGS. 1A and 1B illustrate a conventional common-mode feedback amplifier;

FIG. 5 illustrates an example common-mode feedback amplifier in accordance with an aspect of the present invention;

FIG. 7 illustrates another example common-mode feedback amplifier in accordance with an aspect of the present invention;

DETAILED DESCRIPTION

The present invention solves the instability problem in a common mode feedback circuit of a differential-in differential-out amplifier. In accordance with an aspect of the invention, loop gain of a common mode feedback circuit of a differential-in differential-out amplifier is reduced, thereby improving the phase margin and increasing the stability of the common mode feedback circuit. An example implementation is discussed further, which provides attenuation on open loop gain by introducing a feedback factor in the feedback path of the common mode feedback circuit of a differential-in differential-out amplifier, while maintaining common mode feedback amplifier gain to be one.

A differential-in and differential-out amplifier has two gain stages. Each gain stage is a high impedance node, therefore has a pole associated with it. A more detailed explanation of the relationship between open loop gain, frequency compensation and phase margin in a differential amplifier will now be discussed below in accordance with an aspect of the invention with reference to FIG. 4.

Figure 4:
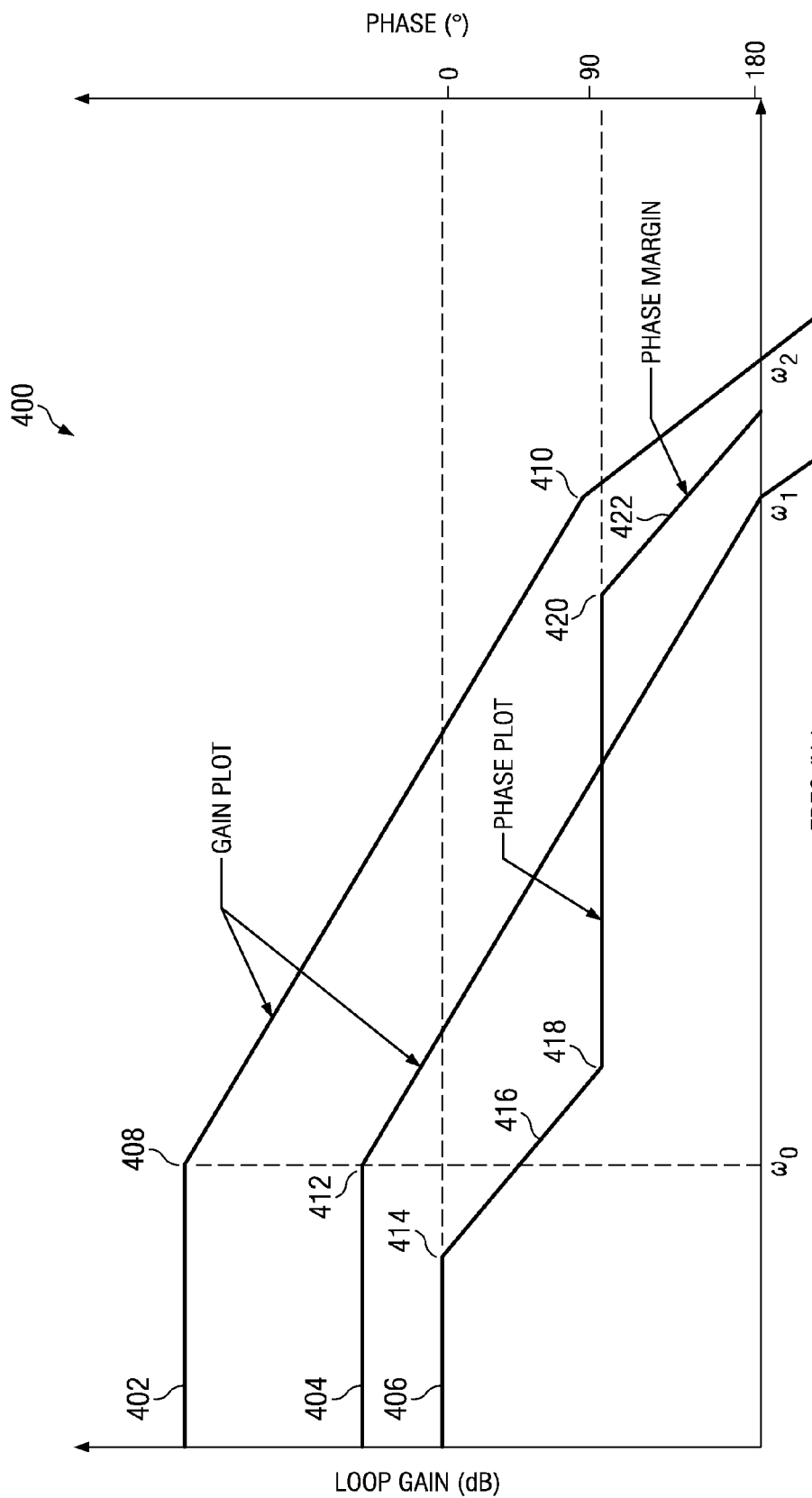
FIG. 4 illustrates Bodé plots of open-loop gain and phase margin of a differential-in differential-out amplifier in accordance with an aspect of the present invention.

FIG. 4 illustrates demonstration Bodé plots of open-loop gain (logarithmic scale in dB) with phase margin (linear scale in degrees) and frequency (logarithmic scale in Hz). In the figure, the right-hand y-axis represents the phase margin in degrees, the left-hand y-axis represents the open loop gain in dB and the x-axis represents the oscillation frequency in Hz. FIG. 4 includes gain plots 402 and 404 and a phase plot 406.

As illustrated in the figure, gain plot 402 represents variation of open loop gain with frequency for a conventional differential amplifier with a high overall gain. Gain plot 404 represents the loop gain of a differential amplifier in accordance with an aspect of the invention. The plot 406 represents a phase plot, which provides approximate phase margin for the given loop gain.

Gain plot 402 represents open loop gain of conventional CMFB amplifier 100 including the feedback factor. Here, it's assumed that the feedback factor is ideal and CMFB amplifier 100 is generating both low frequency and high frequency poles.

As shown in the figure, gain plot 402 has a pole at $\omega_0$ and another pole at $\omega_1$. When loop gain hits $\omega_0$ pole frequency, as shown by 408, loop gain starts rolling down by 20 dB/decade and continues to go down thereafter. When loop gain hits $\omega_1$ pole frequency, as shown by 410, there is another pole and the loop gain starts to attenuate by another 20 dB/decade. Beyond 410, it starts to attenuate by 40 dB/decade and continues.

Behavior of phase plot 406 will be discussed now. At $\omega_0$ pole frequency, as shown by 416, phase plot shows an approximate 45° phase/decade lag in ideal case. The phase lag lasts for approximately 2 decades. A decade before $\omega_0$ pole frequency, phase lag is 0 as shown by 414. From 414 to $\omega_0$ pole frequency, phase lag is 45° as shown by 416. Phase lag becomes 90° as shown by 418 in another decade. As shown in the figure, pole at $\omega_0$ gives a 90° phase lag in the negative direction. After 418, phase plot 406 stays flat until a decade before $\omega_1$ pole frequency as shown by 420. At that point, it rolls down another 45° as shown by 422. After one more decade it hits $\omega_2$ pole frequency at 180°.

Phase margin of a loop is defined as difference between 180 and the phase change at frequency, where gain crosses 0 dB. A feedback loop should always have a positive phase margin to be stable. As shown by gain plot 402, at $\omega_2$ pole frequency, when loop gain touches 0 dB for loop gain of one, phase margin is zero (−180°+180°) for a conventional differential amplifier. Phase margin of zero will result in CMFB amplifier 100 to oscillate. If a feedback factor is added to gain plot 402, which reduces the overall loop gain by, for example, 6 dB or 10 dB, the new gain plot is shown by gain plot 404. For gain plot 404, at 0 dB crossing point, $\omega_2$ pole frequency is moved to $\omega_1$ pole frequency. This results in a phase shift of 135° as shown by 422, which gives a 45° phase margin.

Common mode feedback amplifier is a unity gain amplifier. As shown by gain plot 402, loop gain is high initially. By reducing the loop gain as shown by gain plot 404, in accordance with an aspect of the invention, phase margin is improved from zero to 45°. This is achieved by introducing an attenuation factor in the feedback path of the common mode feedback amplifier, as will be discussed further using FIG. 5.

The differential signal path through a conventional CMFB amplifier requires a balanced pair of signal paths. The common-mode signal is identical on each differential signal path, so for simplification the common-mode signal path can be considered as two differential amplifier signal paths in parallel forming a single common-mode signal path. This allows use of simplified circuit diagrams for common-mode amplifiers without affecting in any way the differential nature of the circuit.

A common-mode feedback amplifier typically requires unity closed loop gain for ideal common-mode control and which is established by connecting both inverting and non-inverting inputs to the same common-mode signal. This innovative connection provides a unity gain common-mode amplifier independent of amplifier loop gain and feedback network values.

Aspects of the present invention will now be described with reference to FIGS. 5-9. A first aspect of the present invention will now be described with reference to FIGS. 5-6.

FIG. 5 illustrates an example CMFB amplifier 500 in accordance with an aspect of the present invention.

CMFB amplifier 500 may operate as a feedback circuit for providing compensation for removing common mode components from the input signals provided to a differential amplifier such that the output signals of the differential amplifier may have the common mode component removed. The example embodiment as illustrated in FIG. 5 represents an improved version of the conventional CMFB amplifier 100 as discussed with reference to FIG. 1.

As illustrated in FIG. 5, CMFB amplifier 500 includes resistor 102, a resistor 502, a differential amplifier 506, a capacitor 504 and voltage source 110.

Differential amplifier 506 may be arranged to receive a signal 508 at the positive input to differential amplifier 506. Differential amplifier 506 may be arranged to receive an input signal 510 at the negative input to differential amplifier 506. Negative input to differential amplifier 506 is additionally arranged to connect to a first terminal of resistor 502 and to a first terminal of resistor 102. First terminal of capacitor 504 may be arranged to connect to ground. Voltage source 110 is arranged to connect to a second terminal of capacitor 504, the second terminal of resistor 502 and the positive input to differential amplifier 506. Differential amplifier 506 may be arranged to provide output signal 114 to a load (not shown). A second terminal of resistor 102 may be arranged to receive output signal 114 from differential amplifier 506.

Typically, differential amplifier 506 has an open-loop gain of $A_{506}$. When differential amplifier 506 is configured as an open-loop, i.e. resistor 102 is removed from the circuit, the magnitude of output signal 114 may equal the voltage difference between the positive and negative inputs of differential amplifier 506 multiplied times the gain of differential amplifier 506, or $A_{506}$. The voltage polarity of output signal 114 is typically the inverse polarity of the voltage of the negative input to differential amplifier 506 and will be the same polarity of the positive input or voltage of the positive input subtracted from the voltage of the negative input to differential amplifier 506. Typically, CMFB amplifier 500 may be considered to be a unity gain amplifier circuit with a closed loop gain of one.

The gain of CMFB amplifier 500 may be determined using the superposition theorem. For this calculation, CMFB amplifier 500 may be analyzed by removing a conductor 512 located between a node 514 and a node 516. The gain of CMFB amplifier 500 with conductor 512 not connected may be calculated as:

$$A_{500\_non\_inverting} \text{ (conductor 512 not connected)} = 1 + R_{102}/R_{502}.$$

Similarly, the close loop gain of common mode, feedback amplifier 500 with source 110 connected to node 516, with the positive input of common mode, feedback amplifier 500 connected to ground and with conductor 512 removed is $$A_{500\_inverting} \text{ (conductor 512 not connected)} = -R_{102}/R_{502}.$$

Using the superposition theorem, the gain of CMFB amplifier 500 may be calculated as:

$$A_{500}(\text{conductor 512 connected}) =$$
$$A_{500\_non\_inverting} + A_{500\_inverting} = 1 + R_{102}/R_{502} - R_{102}/R_{502}.$$

The two resistor terms cancel in the equation above. The gain of CMFB amplifier 500 may be calculated as:

$$A_{500} (\text{conductor } \mathbf{512} \text{ connected})=1.$$

For this aspect of the present invention, CMFB amplifier 500 may be used as a feedback circuit for providing compensation for removing common mode components from the inputs signals provided to a differential amplifier such that the output signals of the differential amplifier may have the common mode components removed. Removal of the common mode components at the output signals of a differential amplifier may enable a differential amplifier to realize its full dynamic range. For this aspect of CMFB amplifier 500, output signal 114 may be fed back into differential amplifier 506 and may be used as a reference for removing the common mode components from the output signals of differential amplifier 506.

Since the output voltage of differential amplifier 506 may be the inverse polarity of its differential input voltage, a zero phase-shift in differential amplifier 506 might realize an output signal that is 180° out of phase from its input signal. If the phase shift of differential amplifier 506 were to be 180°, then the input signal and the output signal would most likely be in phase. A condition of input signal and output signal being in phase for differential amplifier 506 with a closed loop gain equal to one or greater than one may result in the circuit configuration of CMFB amplifier 500 becoming unstable. Typically for a differential amplifier, phase margin is defined as the phase shift due to differential amplifier 506 at frequency where gain crosses 0 dB line is subtracted from 180°. For example, if the phase shift of differential amplifier 506 were 135° at frequency where gain is 0 dB, then the phase margin for the circuit of CMFB amplifier 500 may be calculated as 45° (180°−135°=45°). Typically, a larger value of phase margin is desired, as a circuit with a small phase margin might be susceptible to instability and a circuit with a larger value of phase margin is less susceptible to instability.

For CMFB amplifier 500, the closed loop gain $A_{500}$ in most cases will be one, regardless of the resistance values for resistor 102 and resistor 502. However, the open loop gain of CMFB amplifier 500 may be reduced and may be calculated as $R_{502}/(R_{102}+R_{502})$.

For example, consider the case where $R_{102}$ is equal to $R_{502}$. In this case the attenuation factor may be calculated as ½. Increasing $R_{502}$ as compared to $R_{102}$ may be considered as increasing the overall open-loop gain of CMFB amplifier 500. For example, consider the case where, $R_{502}$ is 30 times larger than $R_{102}$. In this situation, the attenuation factor may be calculated as 1/31, and the open-loop gain of CMFB amplifier 500 may be calculated as 30. Accordingly, by changing $R_{502}$ and $R_{102}$, the overall open-loop gain of CMFB amplifier 500 may be increased or decreased, but in contrast to differential amplifier 106, as discussed above with reference to FIG. 1, the closed loop gain of CMFB amplifier 500 may remain a value of unity. The benefits of this aspect of the present invention will now be discussed.

CMFB amplifier 500 may be connected to a differential amplifier (not shown). A purpose of CMFB amplifier 500 is to feedback the common-mode components to the differential amplifier for removal of common mode components. Since the geometric area typically required for capacitors in semiconductor devices may be large, CMFB amplifier 500 and the differential amplifier may share a common capacitor. This shared capacitor is called a compensation capacitor and the capacitance of the compensation capacitor is required to be large by the common mode feedback (CMFB) path and the differential signal path. It desired that this capacitor value required by the CMFB path be smaller than the capacitor value required by the differential path so that the overall amplifier does not have to spend extra current to achieve the desired slew rate and bandwidth with a bigger than required compensation capacitor. For CMFB amplifier 500, the size of the shared capacitor may typically be determined based on a unity gain setting for CMFB amplifier 500. A larger open-loop gain of CMFB amplifier 500 may be desired to minimize the offset, at the same time a smaller overall loop gain can be achieved by applying a feedback factor in the feedback network, e.g., $R_{102}$ much larger than $R_{502}$. A smaller over all loop gain means the required value of the compensation capacitance for the CMFB amplifier is smaller. Thus, the value of the compensation capacitor can be entirely determined by the need from the differential signal path and its absolute value being no bigger than necessary for the differential signal path.

If the capacitance and geometric size of the shared capacitor is decreased for CMFB amplifier 500, then the common-mode feedback amplifier within differential amplifier 506 may remain stable, contrary to conventional differential amplifier 106 as discussed above with reference to FIG. 1, which may become unstable with a decrease in the capacitance and geometric area of the shared capacitor. As a result of decreasing the open-loop gain of CMFB amplifier 500, in accordance with an aspect of the present invention, an improvement in stability, as a result of improved phase margin, may be realized over conventional differential amplifiers. Furthermore, in accordance with an aspect of the present invention, the resistance used for the feedback circuit for removal of common mode components may be increased which may reduce the power consumption of a differential amplifier. Furthermore, in accordance with an aspect of the present invention, value of the compensation capacitor can be solely determined based on the signal path requirement instead of common mode feedback circuit requirement.

A more detailed example of CMFB amplifier 500 of FIG. 5, will now be discussed with reference to FIG. 6.

Figure 6:
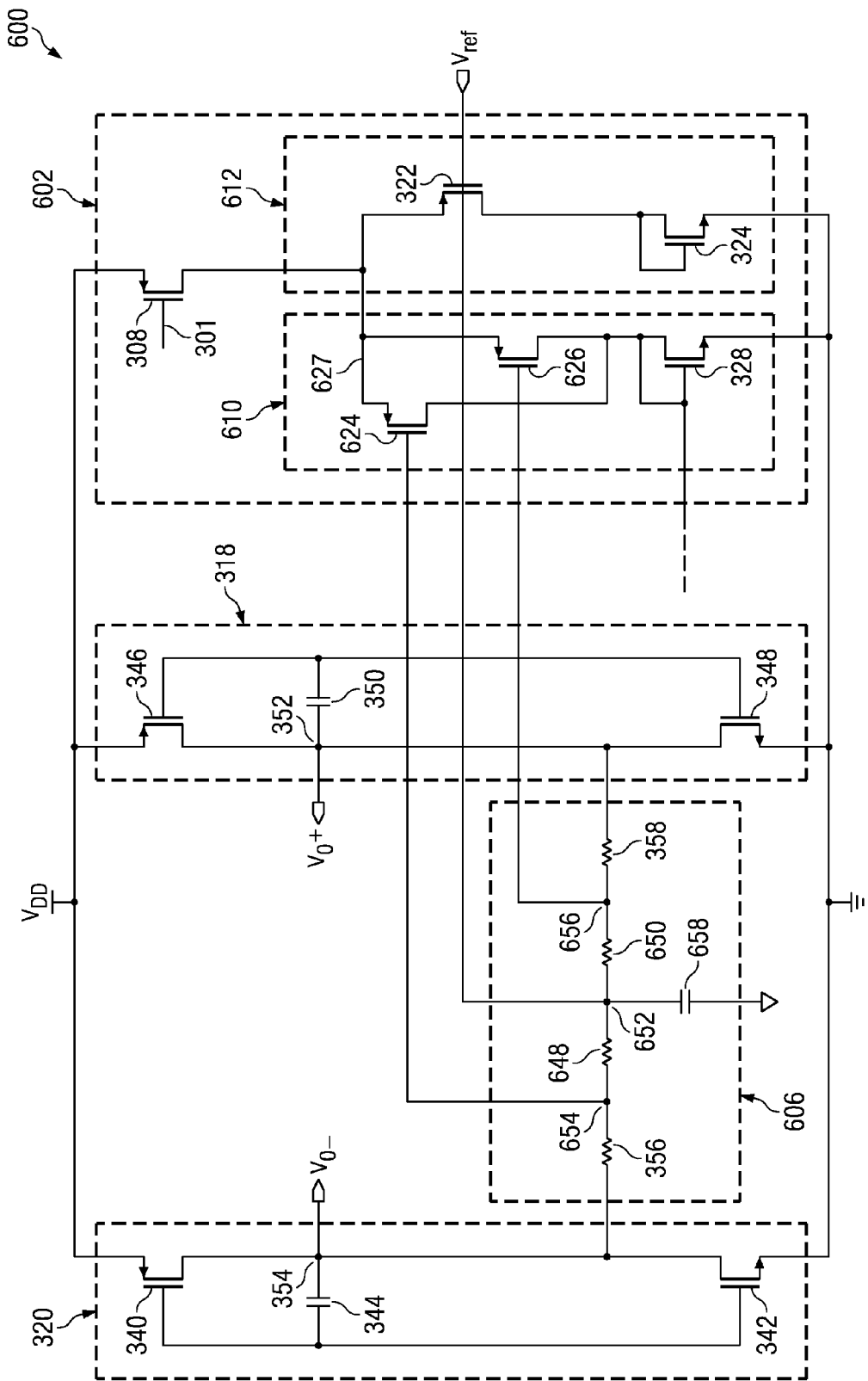
FIG. 6 illustrates a detailed example of a differential-in differential-out amplifier in accordance with an aspect of the present invention.

FIG. 6 illustrates an example embodiment of a differential-in differential-out amplifier 600 in accordance with an aspect of the present invention.

Figure 3:
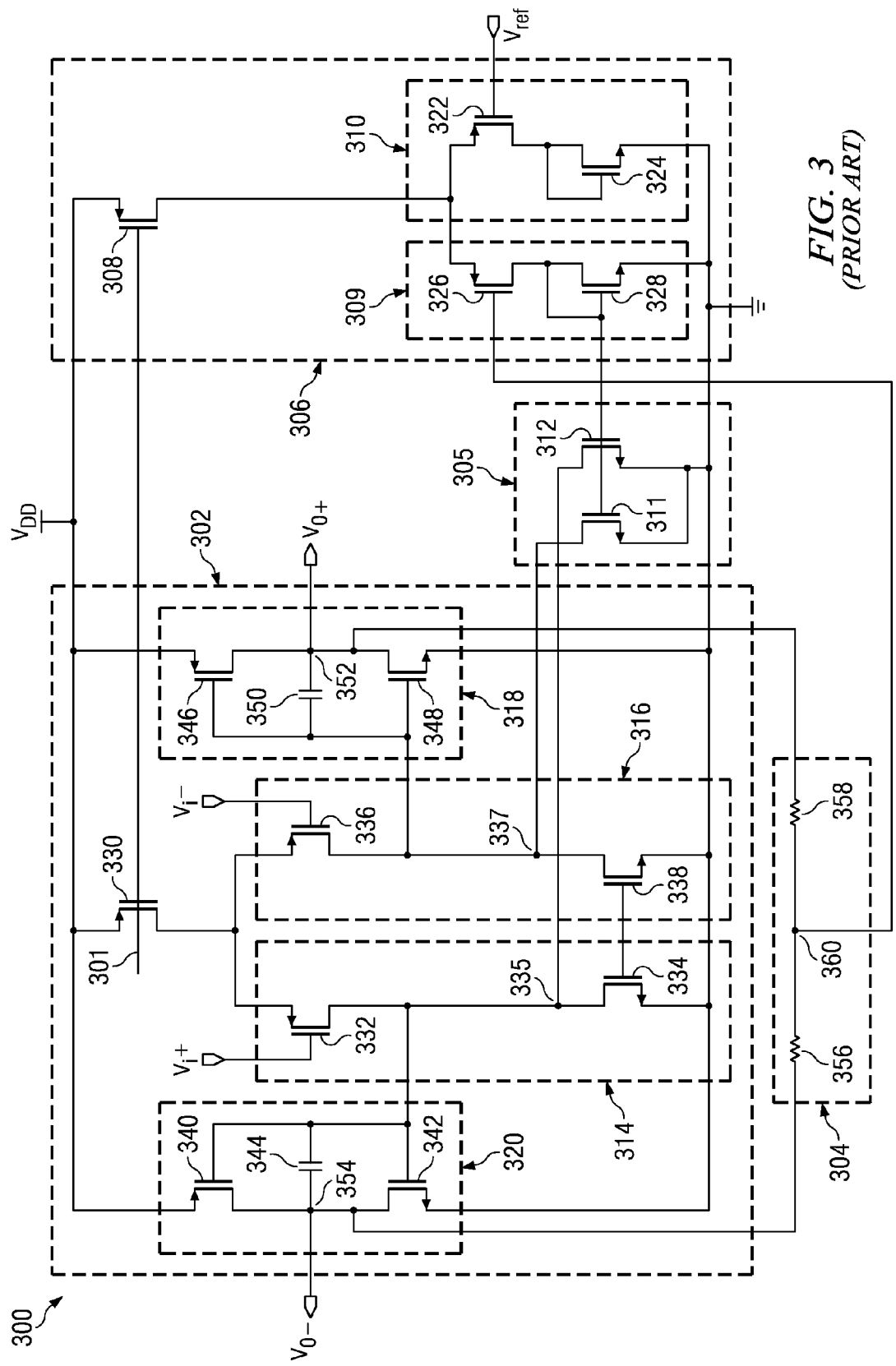
FIG. 3 illustrates an example conventional differential-in differential-out amplifier.

FIG. 6 includes and excludes elements of FIG. 3 and also includes aspects of the present invention. Portions of FIG. 3 have been excluded in FIG. 6 in order to more conveniently describe the operation aspects of the present invention. Portions included in FIG. 3 which have been excluded from FIG. 6 include positive input differential portion 314, negative input differential portion 316, PMOS tail current source 330 and current mirror portion 305.

As illustrated in the figure, differential-in differential-out amplifier 600 includes positive output differential portion 318, negative output differential portion 320, a feedback circuit 602 and a feedback impedance portion 606. It should be noted that the positive output differential portion 318 and negative output differential portion 320 operate in a manner as discussed above with reference to FIG. 3.

Feedback circuit 602 may be arranged to receive $V_{ref}$ as an input reference voltage. Feedback impedance portion 606 may be arranged to be connected between feedback circuit 602 and positive output differential portion 318 and negative output differential portion 320. $V_{ref}$ of FIG. 6 may correspond to signal 508 of FIG. 5. Feedback impedance portion 606 of FIG. 6 may correspond to the combination of resistor 102, resistor 502 and parasitic (yet intentional) capacitor 504 of FIG. 5. Feedback circuit 602, output stage 318 and negative output differential portion 320 of FIG. 6 may correspond to differential amplifier 506 of FIG. 5.

Feedback circuit 602 operates to provide a feedback signal used for compensating or removing common mode components from $V_o^+$ and $V_o^-$, where $V_o^+$ represents output voltage at node 352 for positive output differential portion 318, and $V_o^-$ represents output voltage at node 354 for negative output differential portion 320 of FIG. 6.

Feedback circuit 602 includes PMOS tail current source 308, a sensing leg 610 and a reference leg 612. The source of PMOS tail current source 308 is connected to $V_{DD}$, the gate of PMOS tail current source 308 is connected to input voltage 301 and the drain of PMOS tail current source 308 is connected to each of sensing leg 610 and reference leg 612. Each of sensing leg 610 and reference leg 612 are connected between the drain of PMOS tail current source 308 and ground.

Sensing leg 610 includes a PMOS differential transistor 624, a PMOS differential transistor 626 and NMOS load transistor 328. The differential amplifier of sensing leg 610 is split in two halves, PMOS differential transistor 624 and PMOS differential transistor 626. The source of PMOS differential transistor 624 is connected to the drain of PMOS tail current source 308. The source of PMOS differential transistor 626 is connected to the drain of PMOS tail current source 308. The drain of PMOS differential transistor 624 is connected to the drain of NMOS load transistor 328. The drain of PMOS differential transistor 626 is connected to the drain of NMOS load transistor 328. The gate of PMOS differential transistor 624 is connected to feedback impedance portion 606. The gate of PMOS differential transistor 626 is connected to feedback impedance portion 606. The source of NMOS load transistor 328 is connected to ground, whereas the gate of NMOS load transistor 328 is connected to the drain of NMOS load transistor 328 as well as to the differential amplifier stage (not shown).

Sensing leg 610 may operate to receive a voltage differential between sum of the voltage of gate of PMOS differential transistor 624, and the gate of PMOS differential transistor 626 to differential amplifier transistor 322. Sensing leg 610 may operate to process received voltage differential and output a signal at the union of the sources of PMOS differential transistor 624 and the gate of PMOS differential transistor 626 as denoted by a difference signal 627.

Reference leg 612 includes PMOS differential transistor 322 and NMOS load transistor 324. The source of PMOS differential transistor 322 is connected to the drain of PMOS tail current source 308. The drain of PMOS differential transistor 322 is connected to the drain of NMOS load transistor 324. The gate of PMOS differential transistor 322 is connected to feedback impedance portion 606 and is arranged to receive signal $V_{ref}$. The source of NMOS load transistor 324 is connected to ground, whereas the gate of NMOS load transistor 324 is connected to the drain of NMOS load transistor 324.

Feedback impedance portion 606 operates to generate signals representing the common mode components which are desired to be removed from output $V_o^+$ and $V_o^-$.

Feedback impedance portion 606 includes resistor 356, resistor 358, a resistor 648, a resistor 650 and a capacitor 504. One terminal of resistor 356 is connected to node 354, whereas the other terminal of resistor 356 is connected to a node 654. One terminal of resistor 358 is connected to node 352, whereas the other terminal of resistor 358 is connected to a node 656. One terminal of resistor 648 is connected to node 654, whereas the other terminal of resistor 648 is connected to a node 652. One terminal of resistor 650 is connected to node 656, whereas the other terminal of resistor 650 is connected to node 652. One terminal of capacitor 504 is connected to ground, whereas the other terminal of capacitor 504 is connected to node 652. Node 652 is additionally connected to the gate of PMOS differential transistor 322. Node 654 is additionally connected to the gate of PMOS differential transistor 624. Node 656 is additionally connected to the gate of PMOS differential transistor 626.

Differential-in differential-out amplifier 600 of FIG. 6 may be considered to include differential amplifier 506 of FIG. 5. However, in FIG. 5 both common mode component signals are not illustrated but represented effectively as parallel. Output signal 114 of FIG. 5, which is the effective common-mode compensation signal, is represented as nodes 354 and 352 in FIG. 6. The effective feedback resistor 102 of FIG. 5 corresponds to the parallel arrangement of resistors 356 and 358 of FIG. 6. The effective feedback resistor 502 of FIG. 5 corresponds to the parallel arrangement of resistors 648 and 650 of FIG. 6. A more detailed explanation of the operation of differential-in differential-out amplifier 600 will now be described.

Presume that initially, $V_{ref}$ is 500 mV, whereas the voltages at the respective gates of PMOS differential transistor 624 and PMOS differential transistor 626 are 450 mV. Because the voltage at the gate of PMOS differential transistor 624 and PMOS differential transistor 626 are smaller than the voltage at the gate of PMOS differential transistor 322, sensing leg 610 will start to pull more current, via NMOS load transistor 328. As discussed above with reference to FIG. 3, when NMOS load transistor 328 pulls more current, the voltage at node 352 and node 354 increases. In differential-in differential-out amplifier 600, this increase in voltage at node 352 increases the voltage at node 656, which then increases the voltage at the gate of PMOS differential transistor 626. Similarly, a increase in voltage at node 354 increases the voltage at node 654, which then increases the voltage at the gate of PMOS differential transistor 624.

In short, if the common mode voltage $V_o^+$ and $V_o^-$ are too low, the average voltage at the gate of PMOS differential transistor 626 and 624 (sensing leg 610) will be lower than the voltage $V_{ref}$ at the gate of PMOS differential transistor 322 (reference leg 310). In response, a feedback arrangement will increase the common mode voltage of $V_o^+$ (and similarly the voltage $V_o^-$), which will then increase the voltage at the gate of PMOS differential transistor 626 and the voltage at the gate of PMOS differential transistor 624. But what happens if the common mode voltage $V_o^+$ (and thus the voltage $V_o^-$) is increased too much, which will then increase the voltage at the gate of PMOS differential transistor 626 and the voltage at the gate of PMOS differential transistor 624 too much? This will now be described.

Presume that initially, $V_{ref}$ is 500 mV, whereas the average voltage at the gate of PMOS differential transistor 626 and transistor 624 is 550 mV. Because the average voltage at the gate of PMOS differential transistor 626 and the voltage at the gate of PMOS differential transistor 624 is more than the voltage at the gate of PMOS differential transistor 322, sensing leg 610 will start to pull less current, via NMOS load transistor 328. As discussed above with reference to FIG. 3, when NMOS load transistor 328 pulls less current, the voltage at node 352 decreases. In differential-in differential-out amplifier 600, in this case, the voltage at node 352 decreases and the voltage at node 354 decreases. The decrease in voltage at node 352 decreases the voltage at node 656, which then decreases the voltage at the gate of PMOS differential transistor 626. Similarly, the decrease in voltage at node 354 decreases the voltage at node 654, which then decreases the voltage at the gate of PMOS differential transistor 624.

In short, if the common mode voltage $V_o^+$ and the voltage $V_o^-$ is too high, the average voltage at the gate of PMOS differential transistor 626 and transistor 624 will be higher than the voltage $V_{ref}$ at the gate of PMOS differential transistor 322. In response, a feedback arrangement will decrease the common mode voltage $V_o^+$ and the voltage $V_o^-$, which will then decrease the average voltage at the gate of PMOS differential transistor 626 and transistor 624.

An aspect of the present invention was discussed with reference to FIG. 5 and FIG. 6, which provides benefits over conventional common mode, feedback amplifier 100. As discussed above, the overall open loop gain of the differential-in differential-out amplifier 600 can be reduced without affecting the overall loop gain or closed loop gain of the differential-in differential-out amplifier 600. The reduction in the overall open loop gain can be achieved by controlling attenuation factor of feedback impedance portion 606. Reducing the overall open loop gain improves the phase margin of the differential-in differential-out amplifier 600, which results in improved stability of the circuit. Power consumption of the differential amplifier 506 of differential-in differential-out amplifier 600 can also be reduced by increasing the resistance in the feedback impedance portion 606 and reducing the compensation capacitor.

In the above discussed example CMFB amplifier 600, feedback network 606 is also connected across the differential signal path. Since the value of resistor 356 is equal to the value of resistor 356 and value of resistor 648 is equal to the value of resistor 650. The differential signal at node 354 and 352 are summed together at node 652 and cancelled out. However there is a swing at node 654 and 656. This swing an attenuated version of the signal swing at node 354 and 352. The attenuation factor is $R_{648}/(R_{648}+R_{356})$. The attenuated differential swing appears at the gates of transistors 624 and 626. If this differential swing is large enough, it can cause the current through transistors 624 and 626 vary so as to cause the transconductance, Gm (the change in the drain/source current divided by the change in the gate/source voltage with a constant drain/source voltage), of CMFB amplifier 600 to change. For a differential amplifier to function properly, Gm should not change with input signal so as to avoid instability in the circuit and causing common mode oscillation problem. Therefore, for a large swing in the output signals at node 352 and node 354, CMFB amplifier 600 configurations may not function properly and the differential output could be in the cut-off region and clipped.

Another aspect of the present invention is discussed further which addresses issue of differential swing at the input of CMFB amplifier 600.

A second aspect of the present invention will be now be described with reference to FIGS. 7-8.

FIG. 7 illustrates an example CMFB amplifier 700 in accordance with an aspect of the present invention.

As illustrated in FIG. 7, CMFB amplifier 700 includes resistor 102, resistor 502, a resistor 702, a differential amplifier 704, capacitor 504 and voltage source 110.

Negative terminal of voltage source 110 may be connected to ground. Positive terminal of voltage source 110 may be arranged to provide a reference signal 706. Reference signal 706 may be connected to second terminal of capacitor 504, to first terminal of resistor 502 and to positive input of differential amplifier 704. First terminal of capacitor 504 may be connected to ground. Differential amplifier 704 may be arranged provide output signal 114 to a load. First terminal of resistor 102 may be arranged to receive output signal 114 from differential amplifier 704. Second terminal of resistor 102 may be arranged to be connected by signal 508 to second terminal of resistor 502 and first terminal of resistor 702. Second terminal of resistor 702 may be arranged to connect via a signal 708 to differential amplifier 704.

CMFB amplifier 700 operates to solve the common mode feedback oscillation problem of differential-in differential-out amplifier 600 by utilizing feedback attenuation resistors 502 and 102.

In operation, voltage source 110 provides signal 508 to differential amplifier 704. For purposes of discussion, output signal 114 is attenuated by the resistive divider of the parallel arrangement of resistor 102 and resistor 502, and generates signal 508. Signal 508 is then fed back to differential amplifier 506 as input signal 708 through resistor 702. Since there is no input current signal 508 will same as signal 708 except it will see a filter from resistor 702 and gate capacitance of amplifier 704. If the pole created by resistor 702 and gate capacitor of the amplifier more than the open loop gain then it is safe to assume that signal 508 and signal 708 are the same. Hence, within a frequency of interest, CMFB amplifier 500 of FIG. 5 and CMFB amplifier 700 of FIG. 7 will give same response.

A more detailed example and its advantage of CMFB amplifier 700 of FIG. 7, will now be discussed with reference to FIG. 8.

Figure 8:
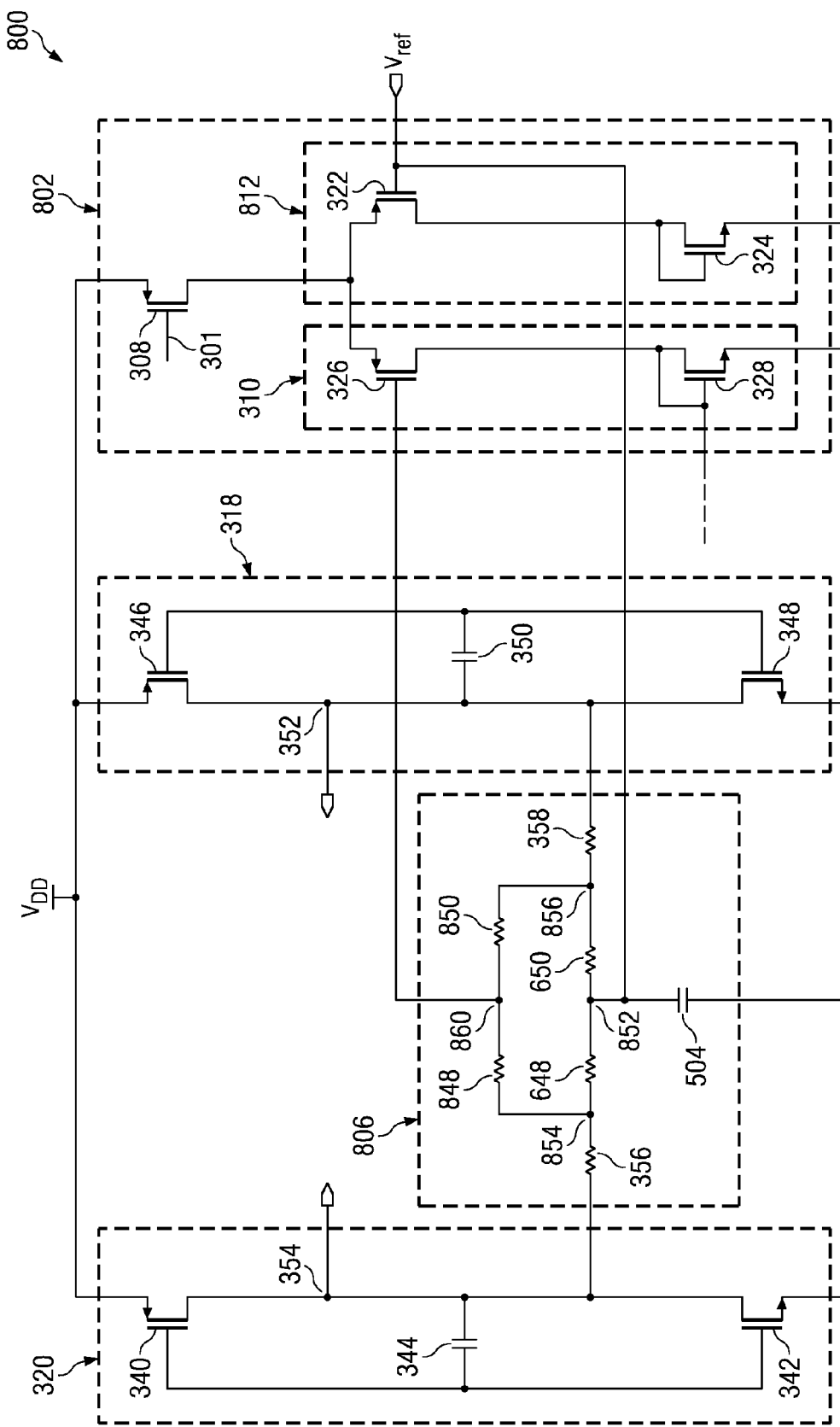
FIG. 8 illustrates an example embodiment of a differential-in differential-out amplifier in accordance with an aspect of the present invention.

FIG. 8 illustrates an example embodiment of a differential-in differential-out amplifier 800 in accordance with an aspect of the present invention.

FIG. 8 includes some elements of FIG. 6 and includes and excludes elements of FIG. 3 in a similar manner as FIG. 6. Portions of FIG. 3 have been also excluded in FIG. 8 in order to more conveniently describe the operation aspects of the present invention. Portions included in FIG. 3 which have been excluded from FIG. 8 include positive input differential portion 314, negative input differential portion 316, PMOS tail current source 330 and current mirror portion 305.

As illustrated in the figure, differential-in differential-out amplifier 800 includes positive output differential portion 318, negative output differential portion 320, a feedback circuit 802 and a feedback impedance portion 806. It should be noted that the positive output differential portion 318 and negative output differential portion 320 operate in a manner as discussed above with reference to FIG. 3.

The common-mode differential stage includes a tail current source, a common-mode positive leg of an input differential portion, a common-mode negative leg of an input differential portion, positive output differential portion 318 and negative output differential portion 320. It should be noted that the tail current source, the common-mode positive leg of an input differential portion and the common-mode negative leg of an input differential portion operate in a manner as discussed above with reference to FIG. 3. To simplify the discussion, the tail current source, the common-mode positive leg of an input differential portion and the common-mode negative leg of an input differential portion have not been included in the figure and will not be discussed.

Feedback circuit 802 includes PMOS tail current source 308, sensing leg 309 and a reference leg 812. The source of PMOS tail current source 308 is connected to $V_{DD}$, the gate of PMOS tail current source 308 is connected to input voltage 301 and the drain of PMOS tail current source 308 is connected to each of sensing leg 309 and reference leg 812. Each of sensing leg 309 and reference leg 812 are connected between the drain of PMOS tail current source 308 and ground.

Reference leg 812 includes PMOS differential transistor 322 and NMOS load transistor 324. The source of PMOS differential transistor 322 is connected to the drain of PMOS tail current source 308. The drain of PMOS differential transistor 322 is connected to the drain of NMOS load transistor 324. The gate of PMOS differential transistor 322 is connected to feedback impedance portion 806 and is arranged to receive reference signal 706 as $V_{ref}$. The source of NMOS load transistor 324 is connected to ground, whereas the gate of NMOS load transistor 324 is connected to the drain of NMOS load transistor 324.

Feedback impedance portion 806 includes resistor 356, resistor 358, resistor 648, resistor 650, a resistor 848, a resistor 850 and capacitor 504. One terminal of resistor 356 is connected to node 354, whereas the other terminal of resistor 356 is connected to a node 854. One terminal of resistor 358 is connected to node 352, whereas the other terminal of resistor 358 is connected to a node 856. One terminal of resistor 648 is connected to node 854, whereas the other terminal of resistor 648 is connected to a node 852. One terminal of resistor 650 is connected to node 856, whereas the other terminal of resistor 650 is connected to node 852. One terminal of resistor 848 is connected to node 854, whereas the other terminal of resistor 848 is connected to a node 860. One terminal of resistor 850 is connected to node 856, whereas the other terminal of resistor 850 is connected to node 860. One terminal of capacitor 504 is connected to ground, whereas the other terminal of capacitor 504 is connected to node 852. Node 852 is additionally connected to the gate of PMOS differential transistor 322. Node 860 is additionally connected to the gate of PMOS differential transistor.

Feedback network 806 addresses the issues of differential swing at the input of amplifier 802. As described above with reference to FIG. 6, there is differential signal swing at node 854 and node 856. Here in this implementation, a resistive summer circuit consisting resistor 848 and resistor 850 are added across node 846 and node 856. At node 860, the differential signal (equal and opposite signal from node 354 and node 352) and common mode signal are added together resulting in cancellation of differential swing and average of the common mode voltage, which is fed back to feedback circuit 802. Thus, feedback network 806 also address the issues of differential swing at the input of CMFB amplifier 800.

Feedback circuit 802 is arranged to receive $V_{ref}$ as an input voltage. Feedback impedance portion 806 is arranged between feedback circuit 802 and the common-mode differential stage. Referring to FIG. 7, $V_{ref}$ corresponds to reference signal 706; feedback impedance portion 806 corresponds to the combination of resistor 102, resistor 502, resistor 702 and capacitor 504; and the combination of feedback circuit 802 and the common-mode differential stage corresponds to differential amplifier 704. A more detailed explanation of the operation of differential-in differential-out amplifier 800 will now be described.

Presume that initially, $V_{ref}$ is 500 mV, whereas the voltage at the gate of PMOS differential transistor 326 is 450 mV. Because the voltage at the gate of PMOS differential transistor 326 is smaller than the voltage at the gate of PMOS differential transistor 322, sensing leg 802 will start to pull more current, via NMOS load transistor 328. As discussed above with reference to FIG. 3, when NMOS load transistor 328 pulls more current, the voltage at node 352 increases. Similarly, when NMOS load transistor 328 pulls more current, the voltage at node 354 increases. In differential-in differential-out amplifier 800, the increase in voltage at node 352 increases the voltage at node 856. Similarly, in differential-in differential-out amplifier 800, the increase in voltage at node 354 increases the voltage at node 854. An increase in voltage in each of node 854 and node 856 then increases the voltage at node 860. An increase in voltage at node 860 then increases the voltage at the gate of PMOS differential transistor 326.

In short, if the voltage $V_o^+$ (and thus the voltage $V_o^-$) is too low, the voltage at the gate of PMOS differential transistor 326 (sensing leg 309) will be lower than the voltage $V_{ref}$ at the gate of PMOS differential transistor 322 (reference leg 310). In response, a feedback arrangement will increase the voltage $V_o^+$ (and thus the voltage $V_o^-$), which will then increase the voltage at the gate of PMOS differential transistor 326 (sensing leg 309). But what happens if the voltage $V_o^+$ (and thus the voltage $V_o^-$) is increased too much, which will then increase the voltage at the gate of PMOS differential transistor 326 (sensing leg 309) too much? This will now be described.

Presume that initially, $V_{ref}$ is 500 mV, whereas the voltage at the gate of PMOS differential transistor 326 is 550 mV. Because the voltage at the gate of PMOS differential transistor 326 is more than the voltage at the gate of PMOS differential transistor 322, sensing leg 802 will start to pull less current, via NMOS load transistor 328. As discussed above with reference to FIG. 3, when NMOS load transistor 328 pulls less current, the voltage at node 352 decreases. Similarly, when NMOS load transistor 328 pulls less current, the voltage at node 354 decreases. In differential-in differential-out amplifier 800, the decrease in voltage at node 352 decreases the voltage at node 856. Similarly, in differential-in differential-out amplifier 800, the decrease in voltage at node 354 decreases the voltage at node 855. A decrease in voltage in each of node 854 and node 856 then decreases the voltage at node 860. A decrease in voltage at node 860 then decreases the voltage at the gate of PMOS differential transistor 326.

In short, if the voltage $V_o^+$ (and thus the voltage $V_o^-$) is too high, the voltage at the gate of PMOS differential transistor 326 (sensing leg 802) will be higher than the voltage $V_{ref}$ at the gate of PMOS differential transistor 322 (reference leg 812). In response, a feedback arrangement will decrease the voltage $V_o^+$ (and thus the voltage $V_o^-$), which will then decrease the voltage at the gate of PMOS differential transistor 326 (sensing leg 802).

Differential-in differential-out amplifier 800 of FIG. 8 includes a representation of differential amplifier 704 of FIG. 7 with both differential sides shown effectively in parallel. The effective common-mode signal is output signal 114 of FIG. 7, which is the effective common-mode signal as output from nodes 354 and 352 of FIG. 8. The effective feedback resistor 102 of FIG. 7 corresponds to the parallel arrangement of resistors 356 and 358 of FIG. 8. The effective feedback resistor 502 of FIG. 7 corresponds to the parallel arrangement of resistors 648 and 650 of FIG. 8. The effective feedback resistor 702 of FIG. 7 corresponds to the parallel arrangement of resistors 848 and 850 of FIG. 8.

The voltage at the junction 854 of resistors 356, 648 and 848 represents the common-mode voltage and a fraction of the differential voltage, that fraction determined by the values of resistors 356 and 648. Similarly, voltage at the junction of resistors 358, 650 and 850 represents the common-mode voltage and a fraction of the differential voltage, that fraction determined by the values of 358 and 650. By design, the ratio 356:648 is identical to the ratio 358:650 and the resistors 848 and 850 are equal. The differential part of voltage at each end of voltage divider 854 and 856 is opposite in phase so the differential voltages will cancel at the center point, leaving only the common-mode voltage at the junction 860 of resistors 848 and 850. The gate of transistor 326 is connected to the junction 860 of 848 and 850 so the current through drain load 328 represents only the common-mode voltage at input 860.

Since common-mode voltage at input 860 has no high frequency differential components, value of capacitor 504 can be increased without affecting differential amplifier stability thus further improving the phase margin of the common-mode amplifier. With capacitor 504 chosen in conjunction with values for resistors 356, 358, 648 and 650 is to remove any high frequency signal component from Vref signal.

As discussed above with reference to FIGS. 7 and 8, differential-in differential-out amplifier 800 solves the problem of common mode feedback oscillation by utilizing feedback attenuation resistors 502 and 102. As discussed above, due to the voltage divider at junction 860, the gate of transistor 326 is a fixed DC voltage, which keeps the drain current in transistor 326 fixed. This solution improves the stability of the circuit by keeping Gm of common-mode, feedback-effect differential amplifier 800 stable.

Figure 9:
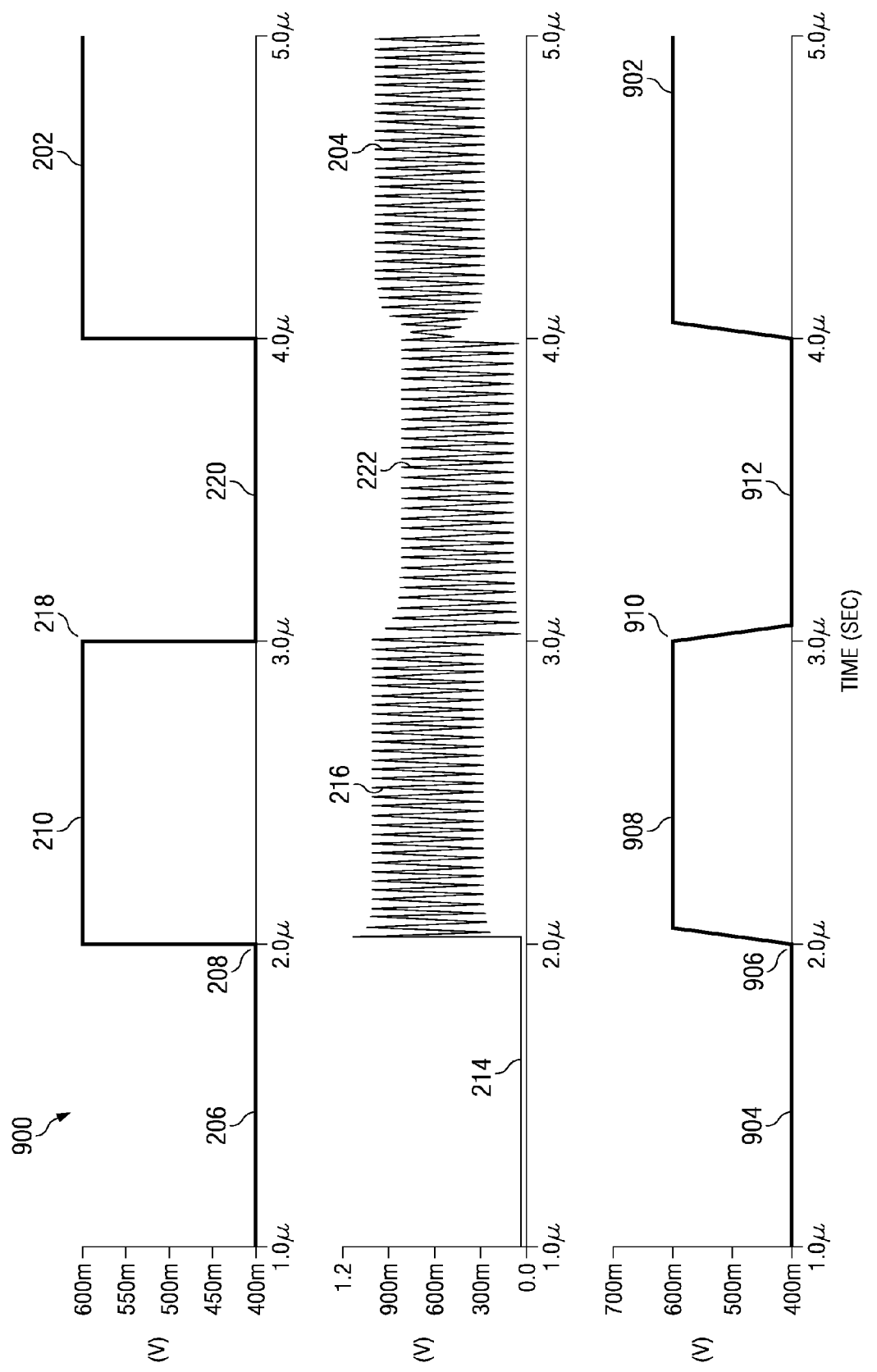
FIG. 9 illustrates a graph that demonstrates the effect of the proposed implementation of differential-in differential-out amplifier of FIG. 8.

FIG. 9 illustrates waveforms that demonstrate the effect of the proposed implementation of FIG. 8.

As illustrated in FIG. 9, waveform 202 represents the differential signal voltage applied to a differential-in differential-out amplifier. The waveform 204 represents typical common-mode instability in a differential-in differential-out amplifier that does not have the proposed implementation. The waveform 902 represents the effect in differential-in differential-out amplifier of the proposed implementation on common-mode oscillation.

Figure 2:
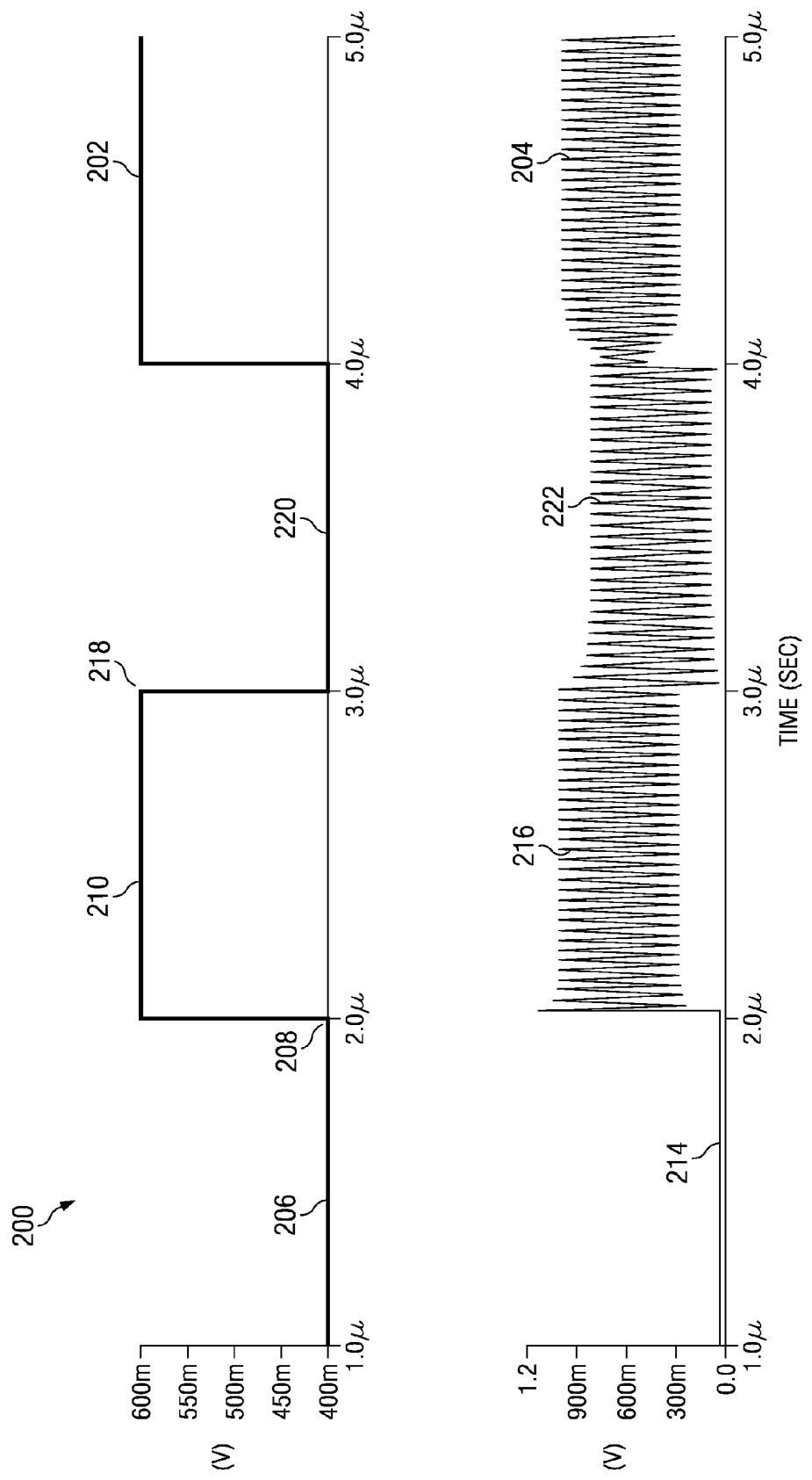
FIG. 2 illustrates waveforms of the conventional CMFB amplifier of FIG. 1.

Waveforms 202 and 204 correspond to waveforms 202 and 204 of FIG. 2. Waveform 902 represents output of the differential-in differential-out amplifier 800 with high frequency components removed, thus providing a stable output. As shown in waveform 902, differential output follows input $V_{ref}$ of waveform 202 for time durations 904, 908 and 912. Transitions 906 and 910 of waveform 902 correspond to steps 208 and 218 of input $V_{ref}$ of waveform 202.

A circuit for common mode feedback amplifier was introduced which provides stable output with lower current consumption. With the help of FIG. 5 through FIG. 9, it was discussed how stability of the common mode feedback amplifier is improved by using the feedback impedance portion. Overall open loop gain of the common mode, feedback amplifier is also reduced, which improves the phase margin and stability of the common mode, feedback amplifier. Aspects of the invention also solve the common mode oscillation problem in the common mode feedback amplifier. Power consumption of the common mode feedback amplifier is reduced by controlling the components of feedback impedance portion. Furthermore, value of the compensation capacitor can be solely determined based on the signal path requirement instead of common mode feedback circuit requirement.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit for use with a reference voltage, said circuit comprising:
   a voltage source;
   a common-mode feedback amplifier connected to said voltage source and arranged to receive the reference voltage, said common-mode feedback amplifier having an input stage, an output stage, a positive input, a negative input and an output; and
   a feedback impedance portion having at least a resistor and a second resistor,
   wherein said output is connected to said feedback impedance portion,
   wherein said feedback impedance portion is additionally connected to said negative input,
   wherein said negative input is coupled to the second resistor, wherein the second resistor is coupled to the positive input of the amplifier, and
   wherein a loop gain, based on said feedback impedance portion, is less than one.

2. A circuit for use with a reference voltage, said circuit comprising:
   a voltage source;
   a common-mode feedback amplifier connected to said voltage source and arranged to receive the reference voltage, said common-mode feedback amplifier having an input stage, an output stage, a positive input, a negative input and an output; and
   a feedback impedance portion,
   wherein said output is connected to said feedback impedance portion,
   wherein said feedback impedance portion is additionally connected to one of said positive input and said negative input, and
   wherein a loop gain, based on said feedback impedance portion, is less than one,
   wherein said voltage source is electrically connected to said positive input and said feedback impedance portion, and
   wherein said feedback impedance portion is connected to said negative input.

3. The circuit of claim 2, wherein said feedback impedance portion comprises a resistor.

4. The circuit of claim 3, wherein said feedback impedance portion further comprises a second resistor.

5. The circuit of claim 4, wherein said resistor and said second resistor are arranged as a resistance divider.

6. The circuit of claim 5,
   wherein said resistor comprises a first terminal and a second terminal,
   wherein said second resistor comprises a third terminal and a fourth terminal,
   wherein said first terminal is electrically connected to said output,
   wherein said second terminal is electrically connected to said third terminal and said negative input, and
   wherein said fourth terminal is electrically connected to said positive input and said voltage source.

7. The circuit of claim 6, wherein said feedback impedance portion further comprises a capacitor connected to said second resistor.

8. The circuit of claim 4, wherein said feedback impedance portion further comprises a third resistor.

9. The circuit of claim 8,
   wherein said resistor comprises a first terminal and a second terminal,
   wherein said second resistor comprises a third terminal and a fourth terminal, wherein said third resistor comprises a fifth terminal and a sixth terminal,
wherein said first terminal is electrically connected to said output,
wherein said second terminal is electrically connected to said third terminal and said fifth terminal,
wherein said fourth terminal is electrically connected to said positive input and said voltage source, and
wherein said sixth terminal is electrically connected to said negative input.

10. The circuit of claim 9,
wherein said resistor comprises a first terminal and a second terminal,
wherein said second resistor comprises a third terminal and a fourth terminal,
wherein said third resistor comprises a fifth terminal and a sixth terminal,
wherein said first terminal is electrically connected to said output,
wherein said second terminal is electrically connected to said third terminal and said fifth terminal,
wherein said fourth terminal is electrically connected to said positive input and said voltage source, and
wherein said sixth terminal is electrically connected to said negative input.

11. The circuit of claim 1, wherein said feedback impedance portion further comprises a capacitor connected to said second resistor.

12. The circuit of claim 11, wherein said feedback impedance portion comprises said resistor and said second resistor arranged as a resistance divider.

13. The circuit of claim 12, wherein said resistance divider is connected to said reference voltage.

14. The circuit of claim 13,
wherein said resistor comprises a first terminal and a second terminal,
wherein said second resistor comprises a third terminal and a fourth terminal,
wherein said first terminal is electrically connected to said positive leg,
wherein said second terminal is electrically connected to said third terminal, and
wherein said fourth terminal is electrically connected to said reference gate.

15. The circuit of claim 14,
wherein said feedback impedance portion further comprises a third resistor and a fourth resistor arranged as a second resistance divider,
wherein said second resistance divider is connected to said reference gate,
wherein said third resistor comprises a fifth terminal and a sixth terminal,
wherein said fourth resistor comprises a seventh terminal and an eighth terminal,
wherein said fifth terminal is electrically connected to said negative leg,
wherein said sixth terminal is electrically connected to said seventh terminal, and
wherein said eighth terminal is electrically connected to said reference gate.

16. The circuit of claim 15,
wherein said common-mode sensing leg comprises a first common-mode sensing transistor and a second common-mode sensing transistor,
wherein said first common-mode sensing transistor comprises a first common-mode sensing gate,
wherein said second common-mode sensing transistor comprises a second common-mode sensing gate,
wherein said second terminal is connected to said first common-mode sensing gate, and
wherein said sixth terminal is connected to said second common-mode sensing gate.

17. The circuit of claim 14, wherein said common-mode sensing leg comprises a common-mode sensing transistor having a common-mode sensing gate.

18. The circuit of claim 17,
wherein said feedback impedance portion further comprises a third resistor, a fourth resistor, a fifth resistor and a sixth resistor,
wherein said third resistor comprises a fifth terminal and a sixth terminal,
wherein said fourth resistor comprises a seventh terminal and an eighth terminal,
wherein said fifth resistor comprises a ninth terminal and a tenth terminal,
wherein said sixth resistor comprises an eleventh terminal and a twelfth terminal,
wherein said fifth terminal is electrically connected to said negative leg,
wherein said sixth terminal is electrically connected to said seventh terminal,
wherein said ninth terminal is electrically connected to said second terminal,
wherein said tenth terminal is electrically connected to said common-mode sensing gate,
wherein said eleventh terminal is electrically connected to said sixth terminal, and
wherein said twelfth terminal is electrically connected to said common-mode sensing gate.

19. A method of amplifying a reference voltage, said method comprising:
generating, by way of a voltage source, an input voltage;
receiving, by way of a common-mode feedback amplifier, the input voltage and the reference voltage, the common-mode feedback amplifier having an input stage, an output stage, a positive input, a negative input and an output; and
amplifying, by way of the common-mode feedback amplifier, the reference voltage,
wherein the output is connected to a feedback impedance portion,
wherein the feedback impedance portion is additionally connected to one of the positive input and the negative input, and
wherein a loop gain, based on the feedback impedance portion, is less than one
wherein said voltage source is electrically connected to said positive input and said feedback impedance portion, and
wherein said feedback impedance portion is connected to said negative input.

20. A system comprising:
a reference voltage generator operable to generate a reference voltage;
a voltage source operable to generate a source voltage;
a common-mode feedback amplifier arranged to receive the source voltage and to receive the reference voltage, said common-mode feedback amplifier having an input stage, an output stage, a positive input, a negative input and an output; and
a feedback impedance portion,
wherein said output is connected to said feedback impedance portion,
wherein said feedback impedance portion is additionally connected to one of said positive input and said negative input, and
wherein a loop gain, based on said feedback impedance portion, is less than one,
wherein said voltage source is electrically connected to said positive input and said feedback impedance portion, and
wherein said feedback impedance portion is connected to said negative input.

* * * * *